United States Patent [19]
James et al.

[11] Patent Number: 5,343,478
[45] Date of Patent: Aug. 30, 1994

[54] COMPUTER SYSTEM CONFIGURATION VIA TEST BUS

[75] Inventors: Larry C. James, West Columbia; Carl W. Kagy, Lexington; Jeffrey F. Gates, Newberry; Jeffrey A. Hawkey; Thomas F. Heil, both of Easley; David L. Simpson, West Columbia, all of S.C.

[73] Assignee: NCR Corporation, Dayton, Ohio

[21] Appl. No.: 800,901

[22] Filed: Nov. 27, 1991

[51] Int. Cl.$^5$ .............................................. G01R 31/28
[52] U.S. Cl. ................................... 371/22.3; 395/575
[58] Field of Search ........................ 371/22.3, 22.1; 324/158 R; 395/575

[56] References Cited

U.S. PATENT DOCUMENTS

| | | | |
|---|---|---|---|
| 4,225,957 | 9/1980 | Doty, Jr. et al. | 371/15 |
| 4,597,080 | 6/1986 | Thatte et al. | 371/25 |
| 4,621,363 | 11/1986 | Blum | 371/25 |
| 4,635,261 | 1/1987 | Anderson et al. | 371/25 |
| 4,701,921 | 10/1987 | Powell et al. | 371/25 |
| 4,710,931 | 12/1987 | Bellay et al. | 371/25 |
| 4,853,929 | 8/1989 | Azuma et al. | 371/25 |
| 4,860,290 | 8/1989 | Daniels et al. | 371/25 |
| 4,879,717 | 11/1989 | Sauerwald et al. | 371/22.3 |
| 4,918,379 | 4/1990 | Jongepier | 324/73.1 |
| 5,115,191 | 5/1992 | Yoshimori | 371/22.3 |
| 5,173,904 | 12/1992 | Daniels et al. | 371/22.3 |
| 5,222,068 | 6/1993 | Burchard | 371/22.3 |

OTHER PUBLICATIONS

IEEE Standard Test Access Port and Boundary-Scan Architecture, IEEE STD 1149.1-1990, May 21, 1990.

The Wall Street Journal, Sep. 19, 1990 Edition, Advertisement, pp. A16-A17.

Primary Examiner—Charles E. Atkinson
Attorney, Agent, or Firm—Jack R. Penrod

[57] ABSTRACT

System configuration, monitoring and control functions are performed in a computer system by means of a serial test bus which is incorporated into the computer system for testing components, for example integrated circuits, used to construct one or more modules of the system. The conventional serial test bus is modified to include register circuitry on modules of the computer system and/or within integrated circuits which are interconnected to construct the modules. These registers are written and read by the serial test bus for configuring the computer system as well as performing other operations such as monitoring and error logging within the computer system. To extend the amount of information which can be contained within these registers, preferably memory devices such as EEPROM, RAM, and the like, are associated with the registers and accessible therethrough. The introduction of memory into the serial test bus permits configuration information to be stored in the modules and/or integrated circuits making up the computer system. If memory and/or other devices external to the serial test bus are included on modules or other components of the system, the time required to access these devices may exceed a default access time defined by the operating speed of the serial test bus. To ensure proper operation with such devices, a pacing or ready signal is generated such that access is delayed until the requested access can be successfully completed.

10 Claims, 21 Drawing Sheets

FIG. 12
24 BITS TO SHIFT   0111010001110   00000001   PPP
                   ⎵⎵⎵⎵⎵⎵⎵⎵⎵⎵⎵⎵   ⎵⎵⎵⎵⎵   ⎵⎵⎵
                   SCAN PATH DATA   HEADER   PAD
FIG. 13
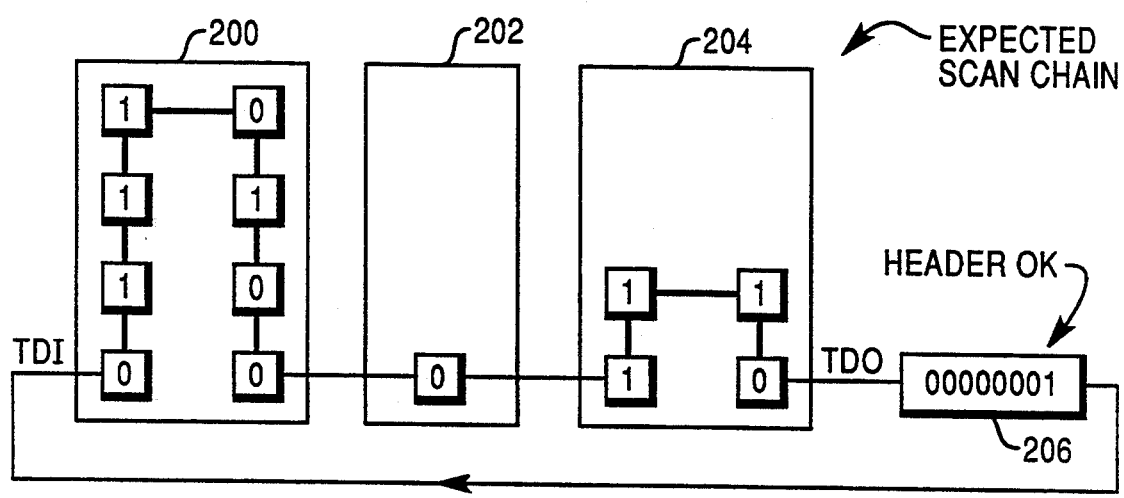
FIG. 14
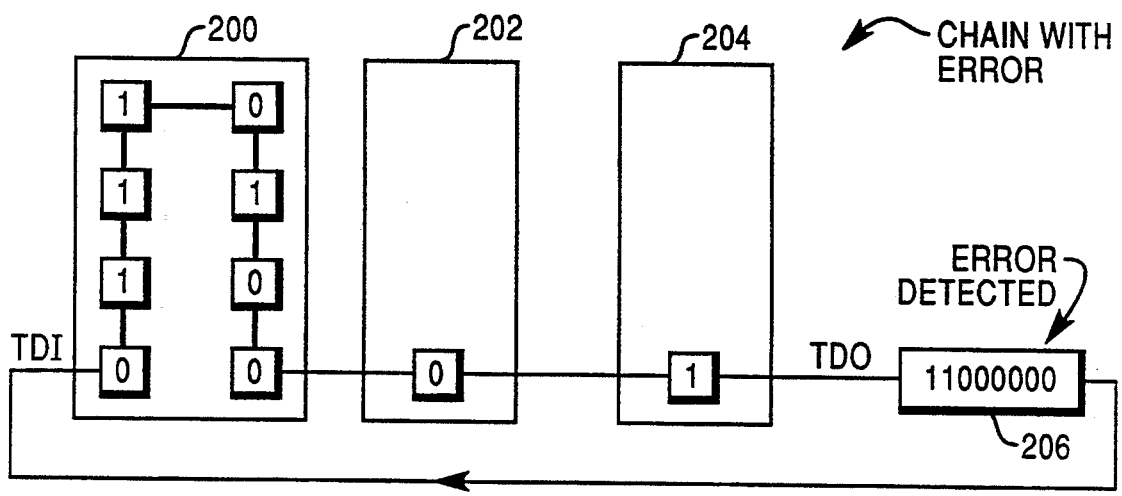

| SCAN PATH TABLES (3 ASIC CHAIN) |||
|---|---|---|
| DATA DESCRIPTION | VALUE | NUMBER OF BYTES |
| ASIC ID             302 | 3 | 2 |
| PTR TO ASIC TYPE TABLE | 3K | 2 |
| PTR TO CONFIGURATION TABLE | 1K | 2 |
| ASIC ID             306 | 7 | 2 |
| PTR TO ASIC TYPE TABLE | 2.83K | 2 |
| PTR TO CONFIGURATION TABLE | .8K | 2 |
| ASIC ID             310 | 6 | 2 |
| PTR TO ASIC TYPE TABLE | 2.83K | 2 |
| PTR TO CONFIGURATION TABLE | .8K | 2 |
|  |  | 18 |

| ASIC TYPE TABLE ||
|---|---|
| DATA DESCRIPTION | NUMBER OF BYTES |
| 1149.1 JTAG ID | 4 |
| LENGTH OF BSR | 2 |
| LENGTH OF BIST REGISTER | 2 |
| BIST CLOCK LENGTH | 4 |
| # OF BITS IN BIST SEED | 2 |
| # OF BITS IN SIGNATURE | 2 |
| PTR TO JTAG TABLE | 2 |
| BIST SEED VECTOR | ? |
| BIST SIGNATURE | ? |
| TOTAL | AT LEAST 18 |

| JTAG TABLE ||
|---|---|
| DATA DESCRIPTION | NUMBER OF BYTES |
| IDCODE | 4 |
| RUNBIST | 4 |
| INTEST | 4 |
| SAMPLE/PRELOAD | 4 |
| OTHER DEFINED INSTRUCTIONS | ? |
| LENGTH OF INSTRUCTION REGISTER | 1 |
| TOTAL | AT LEAST 17 |

| SIGNAL | OUTPUT DRIVABLE | VALUE DRIVEN | DRIVER | BOARD 1 INPUT 7 | BOARD 1 VALUE SAMPLED | BOARD 2 INPUT 7 | BOARD 2 VALUE SAMPLED | BOARD 3 INPUT 7 | BOARD 3 VALUE SAMPLED |
|---|---|---|---|---|---|---|---|---|---|
| DATA12 | 1 | 0 | 2 | 1 | 1 | 1 | X | 1 | 0 |
| DATA13 | 1 | 1 | 2 | 1 | 1 | 0 | X | 0 | X |
| DATA14 | 0 | X | 2 | 1 | X | 0 | X | 0 | X |
| DATA15 | 0 | X | 2 | 1 | X | 0 | X | 0 | X |
| . | . | . | . | . | . | . | . | . | . |
| . | . | . | . | . | . | . | . | . | . |
| . | . | . | . | . | . | . | . | . | . |

COMPUTER SYSTEM CONFIGURATION VIA TEST BUS

BACKGROUND OF THE INVENTION

The present invention relates generally to computer systems and, more particularly, to a method and apparatus for operating a computer system to configure the system via a serial test bus included within the system. The present invention not only permits system configuration via a serial test bus but also permits status monitoring, error logging and comparable operations to be performed via a serial test bus during system operation. The present invention is generally applicable to computer systems and components and, in its broadest aspects, can be utilized within a single integrated circuit.

Historically, initial system configuration has been implemented by physical devices on circuit boards making up the system. For example, switches, plugs, jumpers, connectors and the like were used for configuration. Accordingly, configuration or reconfiguration of a computer system required significant time and the resulting configuration often included errors which required still more time to correct. In addition, the reliability of the computer system was reduced due to the possible failures of the physical configuration devices.

An improved computer system configuration arrangement is provided by using integrated circuit (IC) devices to store system configuration data. The IC devices are initialized by entering configuration data into the devices from an interactive controller which usually retains the configuration data between periods of time when the system is active or until system reinitialization is requested.

In systems with high levels of integration, IC system configuration devices are implemented as application specific integrated circuits or ASICs. The ASICs often do not interface with a system or processor bus and therefore cannot be accessed directly under program control. Therefore, a separate configuration port or bus is needed to interface with the ASICs for configuration purposes. Unfortunately, the provision of a separate configuration bus adds to the cost and complexity of a computer system and also tends to increase the connection points or pin counts required for the ICs or ASICs used to construct a computer system.

Accordingly, there is a need for simple and effective way of accessing the ICs or ASICs of a computer system for system configuration without the requirement of a separate configuration bus. Preferably, the system configuration access arrangement would also provide for other system operations such as status monitoring, error logging and comparable operations within the computer system.

SUMMARY OF THE INVENTION

This need is met by the method and apparatus of the present invention wherein system configuration as well as other monitoring and control functions are performed in a computer system by means of a serial test bus which is commonly incorporated into the computer system for testing components, for example integrated circuits, used to construct modules of the computer system. The conventional serial test bus is modified to include register circuitry on modules of the computer system and/or within integrated circuits which are interconnected to construct the modules. The registers thus included within the computer system are written and read by the serial test bus for configuring the computer system as well as performing other operations such as monitoring and error logging within the computer system. To extend the amount of information which can be contained within these registers, preferably memory devices such as EEPROM, RAM, and the like, are associated with the registers.

The introduction of memory into the serial test bus permits configuration information to be stored in the modules and/or integrated circuits making up the computer system. For this arrangement of the present invention, the serial bus is able to access the configuration information stored within modules or other components of the computer system and then configure the system by utilizing the retrieved configuration information to derive necessary settings for the registers. When memory and/or other devices external to the serial test bus are included on modules or other components of the system, the time required to access these devices may exceed a default access time defined by the operating speed of the serial test bus. To ensure proper operation with such devices, a pacing or ready signal is generated in accordance with the present invention such that access is delayed until the ready signal is active. Thus, when such a device is accessed, it deactivates the ready signal until the requested access can be successfully completed.

In accordance with one aspect of the present invention, a method of operating a computer system test bus to configure a computer system including the test bus comprises the steps of: maintaining configuration information for the computer system; providing configuration register means for receiving the configuration information; interfacing the configuration register means with the test bus; defining a write operation for the test bus to write the configuration register means via the test bus; and, performing the write operation to transfer the configuration information to the configuration means to thereby configure the computer system.

In accordance with another aspect of the present invention, a method of operating a computer system test bus to configure and monitor a computer system including the test bus comprises the steps of: maintaining configuration information for the computer system; providing register means for receiving the configuration information and information representative of operation of the computer system; interfacing the register means with the test bus; defining a write operation for the test bus to write the register means via the test bus; performing the write operation to transfer the configuration information to the register means to thereby configure the computer system; defining a read operation for the test bus to read the register means via the test bus; and, performing the read operation to retrieve information representative of operation of the computer system from the register means.

This method may further comprise the steps of: generating a ready signal indicating that the register means is ready to be read and written; inactivating the ready signal in response to initiation of performance of read and write operations in response to the read and write signals if the register means is not ready to be read and written; and, reactivating the ready signal when the register means is ready to be read and written. To expand the capabilities of the method it may also further comprise the steps of: providing memory means for storing information defining the computer system; and, interfacing the register means with the memory means. Preferably, the step of maintaining configuration information for the computer system is performed by storing the configuration information in the memory means.

In accordance with still another aspect of the present invention, a serial test bus for a computer system comprises test bus controller means for generating timing, data and control signals for operation of the test bus. Test access means operable in response to signals from the test bus controller means is provided for testing the computer system. The test access means includes register means for receiving data from the test bus controller means for operation of the computer system.

In accordance with yet another aspect of the present invention, a serial test bus for a computer system comprises test bus controller means for generating timing, data and control signals for operation of the test bus. Test access means operable in response to signals from the test bus controller means is provided for testing and configuring the computer system. The test access means comprises configuration register means for receiving data from the test bus controller means for configuring the computer system.

To extend the capabilities of the present invention, the configuration register means may further provide for receiving status and error data from the computer system. For this arrangement, the test bus controller means further provides for reading the configuration register means for monitoring and error logging operations for the computer system. If the configuration register means cannot respond within a defined test bus access time, pacing means are provided for delaying operation of the test bus controller means when performing read and write operations on the configuration register means. Preferably, the serial test bus further comprises memory means associated with the configuration register means and accessible therefrom for storing information defining the computer system.

It is thus an object of the present invention to provide an improved method and apparatus for a serial test bus for a computer system through which system configuration can be performed; to provide an improved method and apparatus for a serial test bus for a computer system through which system configuration can be performed by means of registers which are associated with components of the computer system and receive configuration information for the system; and, to provide an improved method and apparatus for a serial test bus for a completer system through which system configuration can be performed by means of registers which are provided on components of the computer system and interface with memory used to store the system configuration information as well as other information relating to system operation.

Other objects and advantages of the invention will be apparent from the following description, the accompanying drawings and the appended claims.

BRIEF DESCRIPTION OF THE DRAWINGS

FIGS. 12-14 illustrate instruction error detection for a CAT bus in accordance with one aspect of the present application;

FIGS. 15-18 is a schematic illustration of the relationship of devices within a boundary scan path and the corresponding tables in accordance with the present application;

DETAILED DESCRIPTION OF THE INVENTION

The present application discloses a number of structural and operational modifications to a serial test bus which has been standardized by the Institute of Electrical and Electronics Engineers, IEEE, and is designated as the IEEE Std 1149.1. This serial test bus was developed by a Joint Test Action Group, JTAG, composed of members from both Europe and North America and is often referred to as a JTAG bus. Herein, the standard serial test bus is referred to interchangeably as an IEEE 1149.1 bus, a JTAG bus and/or, once modified in accordance with the disclosures of the present application, as a configuration and test (CAT) bus. The later name, CAT bus, reflects one of the purposes of the modifications of the JTAG bus which is to permit configuration of a computer system including a serial test bus by means of the serial test bus. While portions of the standard JTAG bus will be described herein, the structure and operation of the standard JTAG bus are well known to those skilled in the art. Those desiring additional knowledge or details of the standard JTAG bus are referred to the above noted IEEE Std 1149.1.

Figure 1:
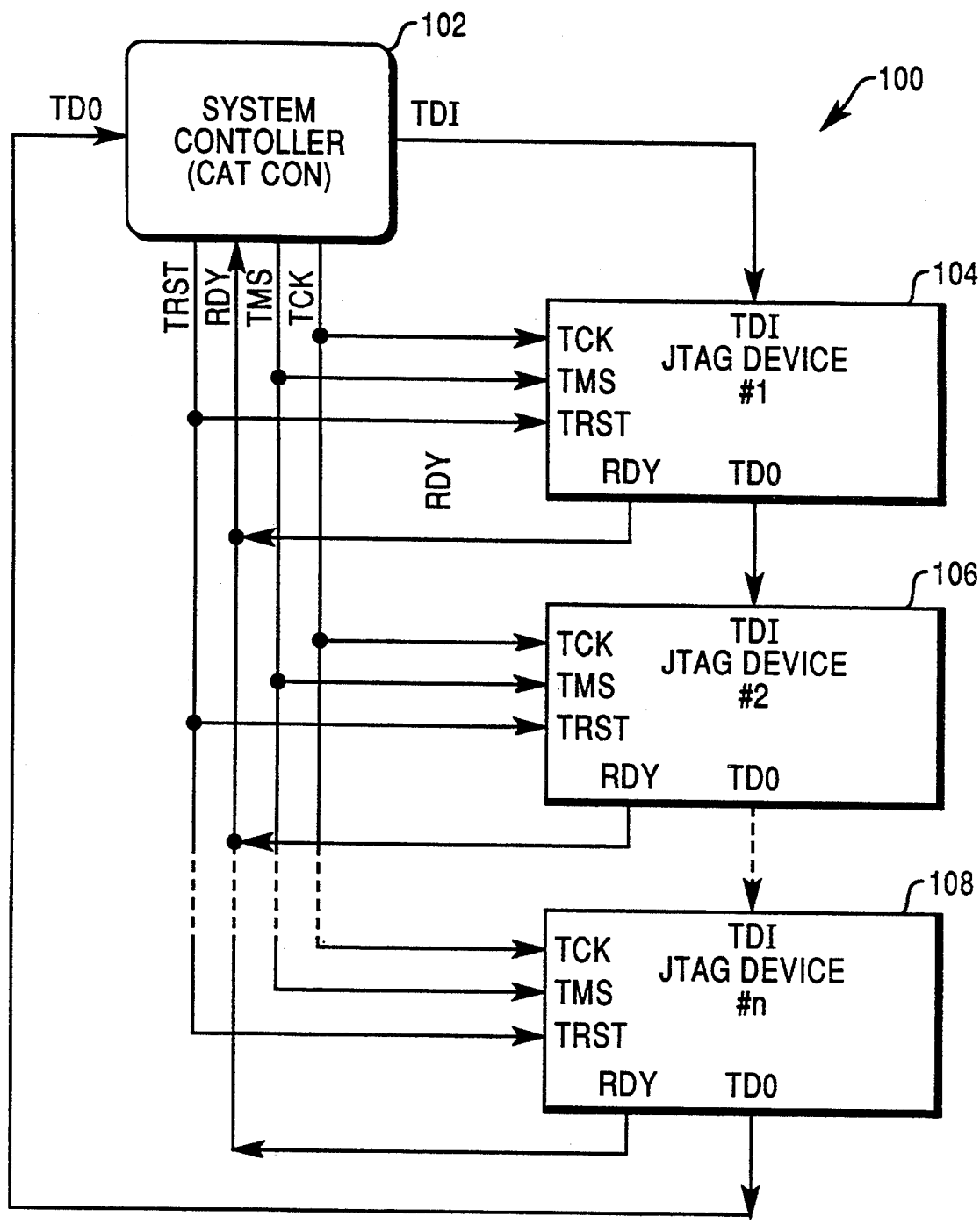
FIG. 1 is a block diagram schematically illustrating the connections and signals for a standard serial test bus (IEEE Std 1149.1) adapted to operate with an additional pacing or ready RDY signal, of the present application.

FIG. 1 schematically illustrates the connections and signals for a JTAG bus adapted to operate with an additional pacing or ready RDY signal to form a CAT bus system 100. The CAT bus system 100 includes a bus system controller 102 which will also be referred to herein as a CAT controller and, as illustrated in FIG. 1, generates the following signals: test data input, TDI; test clock, TCK; test mode select, TMS; and, an optional test reset, TRST. The test data output, TDO, and ready, RDY, signals are generated by the devices 104, 106 and 108 referred to as JTAG devices #1, #2 and #n in FIG. 1 which are connected to the bus system controller 102. The generation and use of the RDY signal, the only nonstandard JTAG bus signal of FIG. 1, will be fully described hereinafter.

Figure 2:
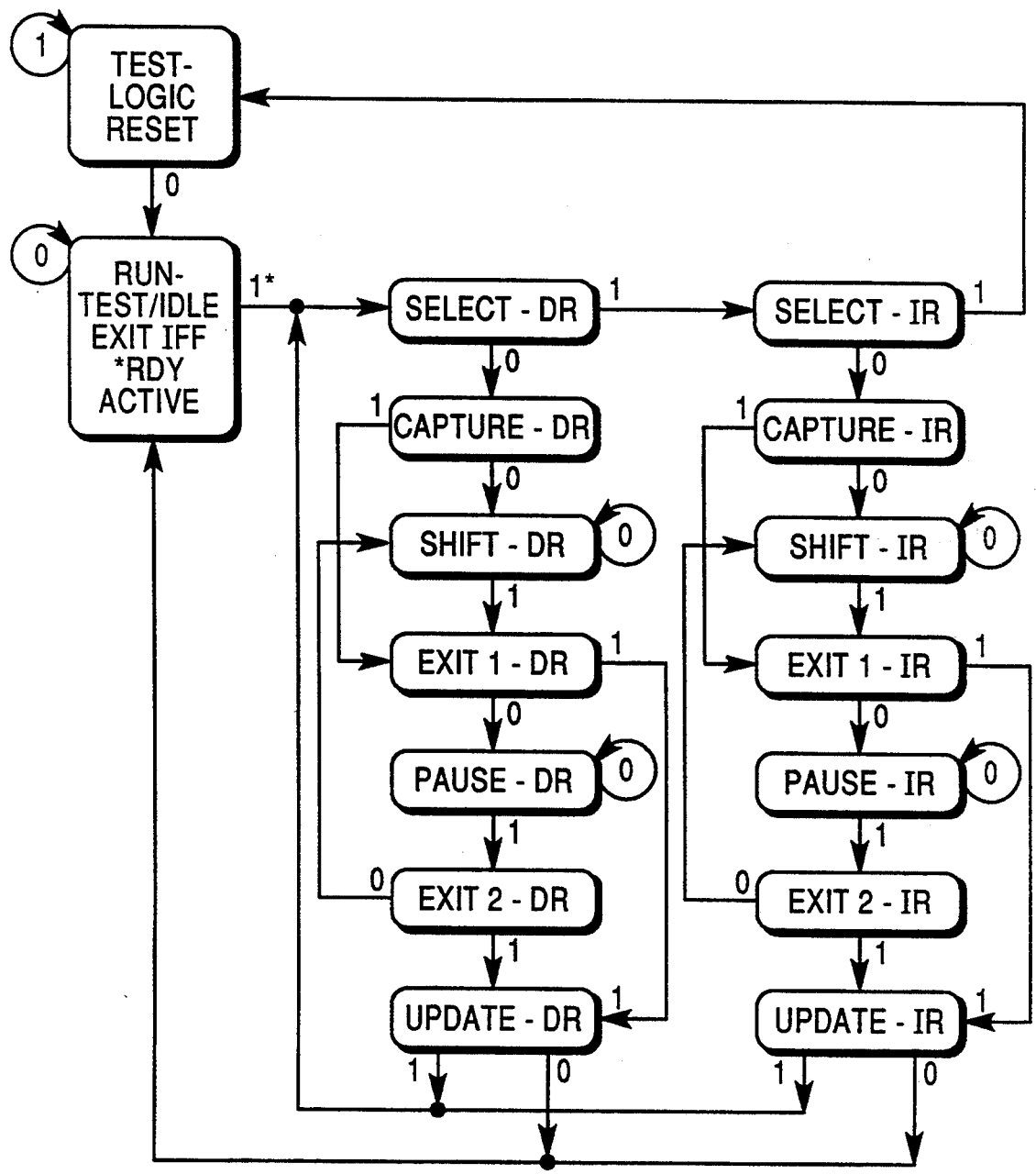
FIG. 2 is a state diagram for a test access port (TAP) controller of an IEEE 1149.1 serial test bus adapted to operate with the RDY signal of the present application.
Figure 3:
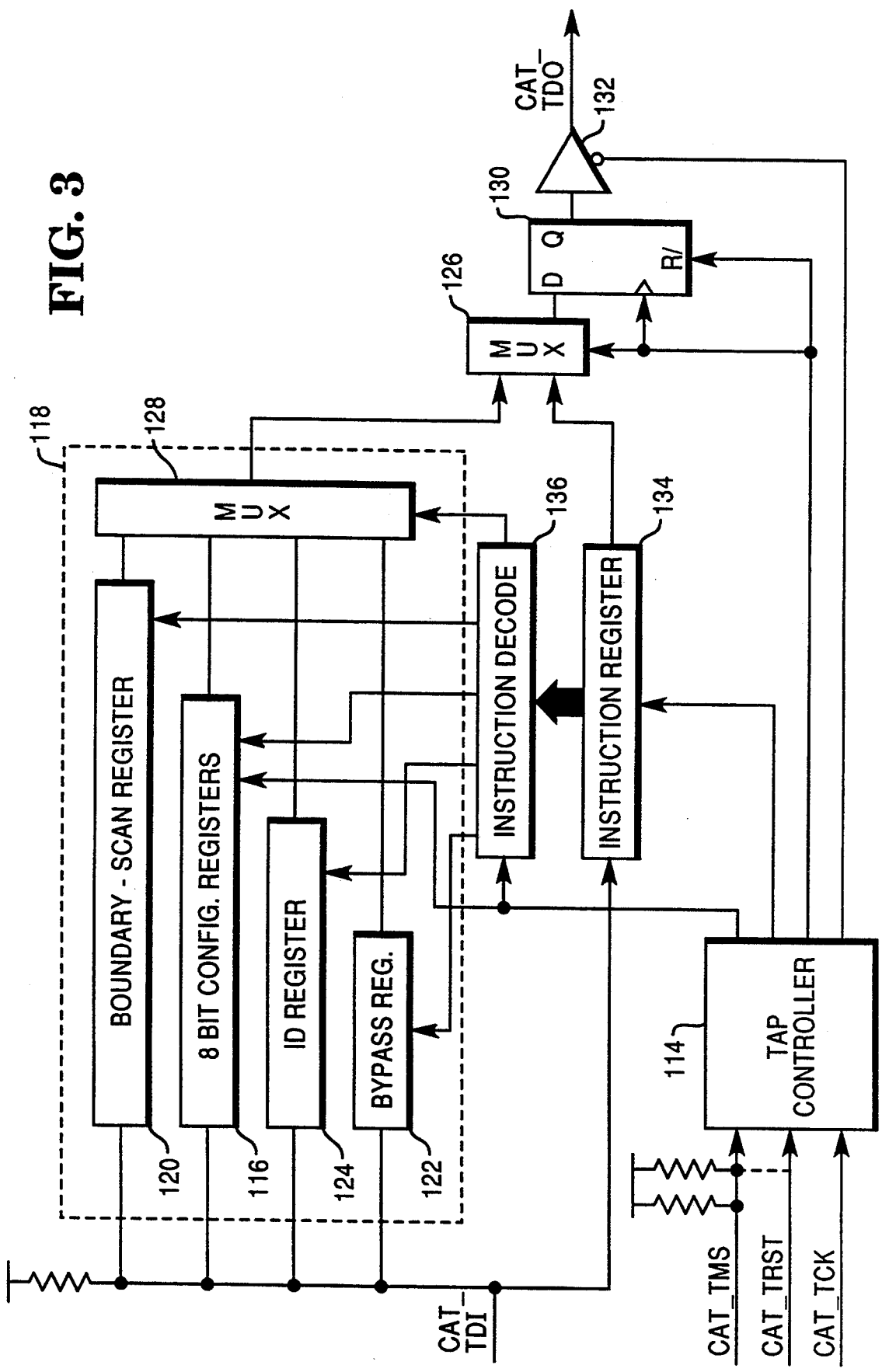
FIG. 3 is a schematic block diagram illustrating an architecture for an IEEE 1149.1 serial test bus modified in accordance with one of the broadest aspects of the present application to include a plurality of registers designated in FIG. 3 as configuration registers which are accessible through the serial test bus.

FIG. 2 is a state diagram 110 for a test access port (TAP) controller of an IEEE 1149.1 serial test bus adapted to operate with the RDY signal of the present application. A TAP controller 114 is shown in FIG. 3 which illustrates the architecture of an IEEE 1149.1 serial test bus modified in accordance with one of the broadest aspects of the present application to include a plurality of registers designated in FIG. 3 as configuration registers 116 which are accessible through the serial-test bus. The configuration registers 116 are included along with a number of other standard JTAG registers collectively identified as test data registers and shown within a circuit block 118.

The standard JTAG registers include a boundary scan register 120 which is associated with each input and output connection for an integrated circuit, module or other entity which is to be tested by the JTAG bus. The boundary scan register 120 permits control and observation of signals at the input and output connections of an entity by means of standard JTAG bus operations well known in the art. A BYPASS register 122 and an optional identification, ID, register 124 are also shown within the block 118. The outputs of the registers 116, 120, 122 and 124 are selectively connected to an output multiplexer 126 through a register selector multiplexer 128. The output multiplexer 126 is connected to a D-flip-flop 130 having a Q output terminal which is connected to a buffer circuit 132 which ultimately passes the test data output, TDO, signal back to the bus system controller 102. The TDO signal is indicated as a CAT_TDO in FIG. 3 since a configuration and test bus architecture is illustrated. Thus, each of the registers 116, 120, 122 and 124 can be selectively connected into the TDI-TDO JTAG bus serial scan path.

The TAP controller 114 is controlled by the bus system controller 102 via the control signals: test clock, TCK; test mode select, TMS; and, test reset, TRST, to generate control signals for the output multiplexer 126, the D-flip-flop 130, the buffer circuit 132, an instruction register 134 and an instruction decoder circuit 136 which is connected to receive instructions from the instruction register 134 and in turn generate control signals for the registers 116, 120, 122 and 124 and corresponding select signals for the register selector multiplexer 128. The states of the state diagram 110 of FIG. 2 for operation of the TAP controller 114 are as follows:

in the Test-Logic-Reset (TLR) state, the test logic is disabled so that normal operation of the circuit or module logic can operate unhindered by the JTAG test bus;

the Run-Test-Idle (RTI) state is a state between scan operations which allows idling or pacing of instruction execution;

the Select-DR (SDR) state is a temporary state in which all test data registers selected by a current instruction retain their previous state;

the Select-IR (SIR) state is a temporary controller state in which all test data registers selected by the current instruction retain their previous state;

in the Capture-DR (CDR) state, data may be parallel loaded into test data registers selected by the current instruction or the previous register state remains unchanged if the test data register selected does not have a parallel input;

in the Shift-DR (SDR) state, the test data register connected between TDI and TDO as a result of the current instruction shifts data one stage towards its serial output on each rising edge of TCK;

the Exit1-DR (E1DR) state is a temporary controller state from which the controller scanning process can be terminated or paused;

in the Pause-DR (PDR) state shifting of test data register in the serial path between TDI and TDO is temporarily halted;

the Exit2-DR (E2DR) state is a temporary state from which the controller can enter the Shift-DR state or an Update-DR state;

in the Update-DR (UDR) state, data is latched onto the parallel output of test data registers from the shift register path on the falling edge of TCK;

in the Capture-IR (CIR) state, the shift register contained in the instruction register of the controller loads data on the rising edge of TCK;

in the Shift-IR (SIR) state the shift register contained in the instruction register is connected between TDI and TDO and shifts data one stage towards its serial output on each rising edge of TCK;

the Exit1-IR (E1IR) state is a temporary controller state from which the controller scanning process can be terminated or paused;

the Pause-IR (PIR) state allows shifting of the instruction register to be halted temporarily;

the Exit2-IR (E2IR) state is a temporary state from which the controller can enter the Shift-IR state or an Update-IR state; and, for the Update-IR (UIR) state the instruction shifted into the instruction register is latched onto the parallel output from the shift register path to become the current instruction.

The state diagram 110 for the TAP controller 114 is identical to the standard JTAG TAP controller state diagram shown in the IEEE Std 1149.1; however, in FIG. 2 it is shown to depict the operation of the RDY signal. The logic state values (0 and 1) shown adjacent to each state transition in the state diagram 110 of FIG. 2 represent the logic values of the TMS signal at the time of a rising edge of the TCK signal. Since the bus system controller 102 is the source of the TMS signal, it is adapted for operation with the RDY signal such that the RDY signal must be active before the bus system controller 102 will cause transition of the TAP controller 114 from the RTI state. Note that the bus system controller 102 can operate with standard JTAG devices since such standard devices will never deactivate the RDY signal.

Figure 5A:
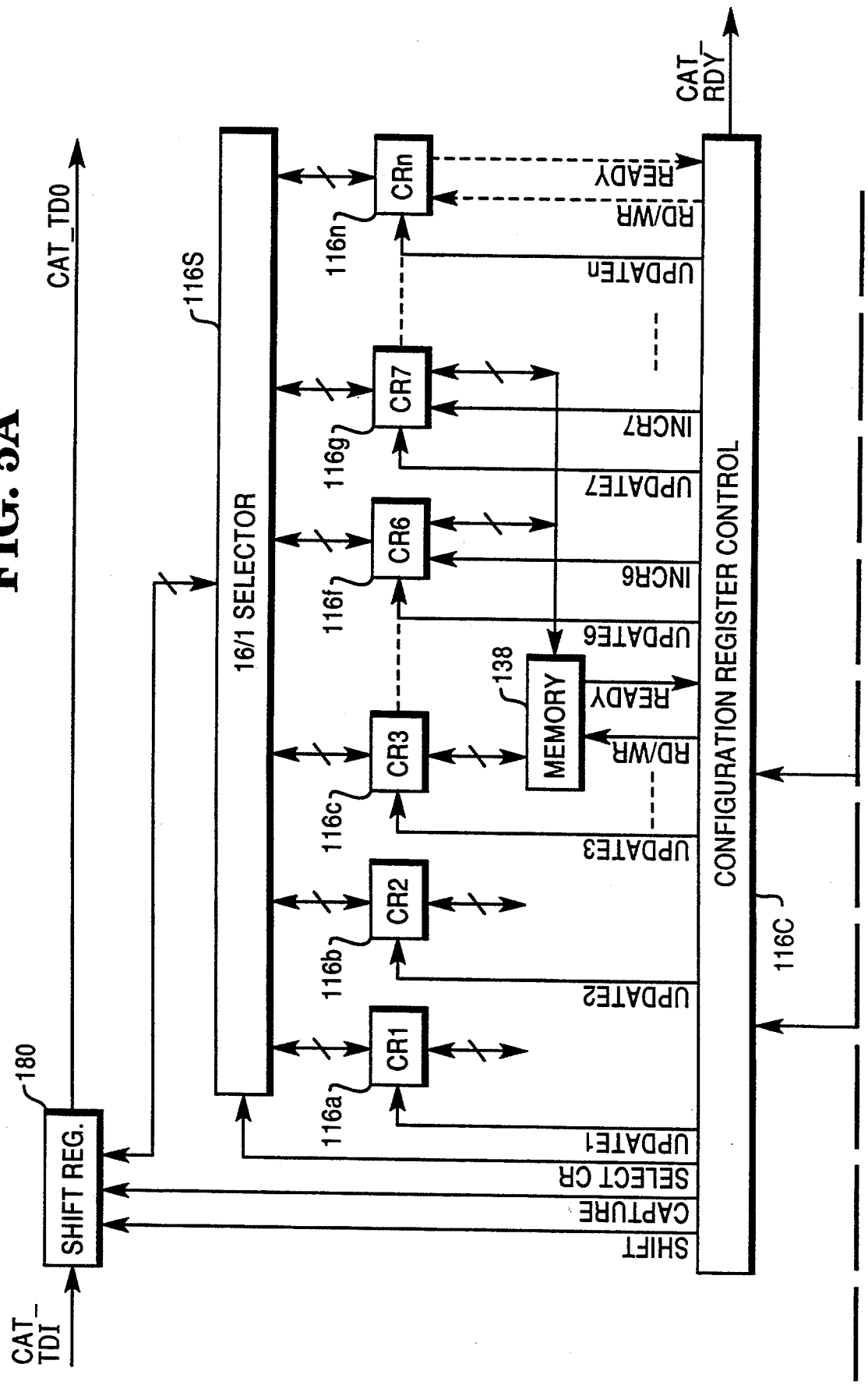
FIG. 5 comprised of FIGS. 5A and 5B, is a schematic block diagram of an IEEE1149.1 serial test bus modified in accordance with the present application illustrating the configuration registers of FIG. 3 in more detail and including memory accessible from the test bus.
Figure 5B:
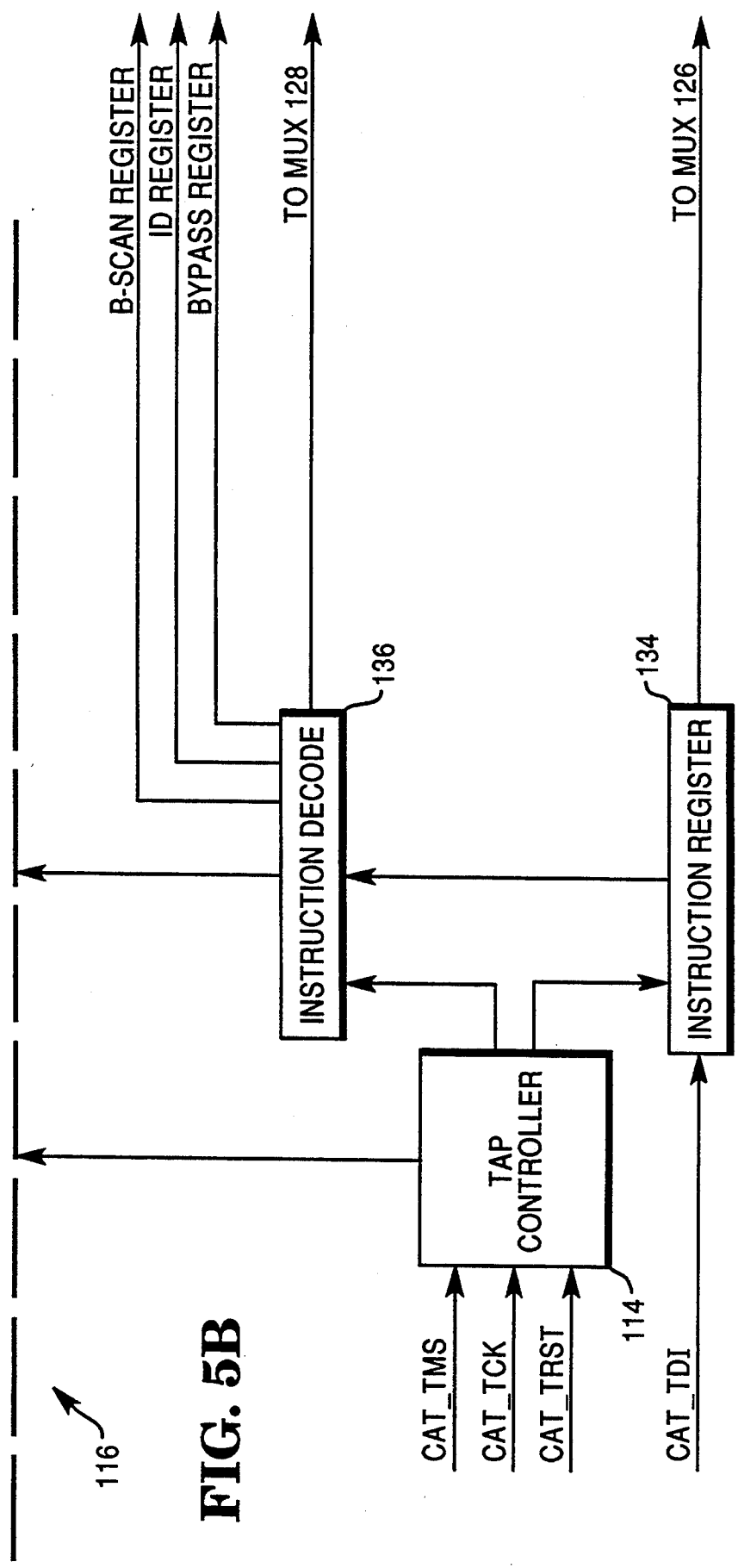
Figure 7:
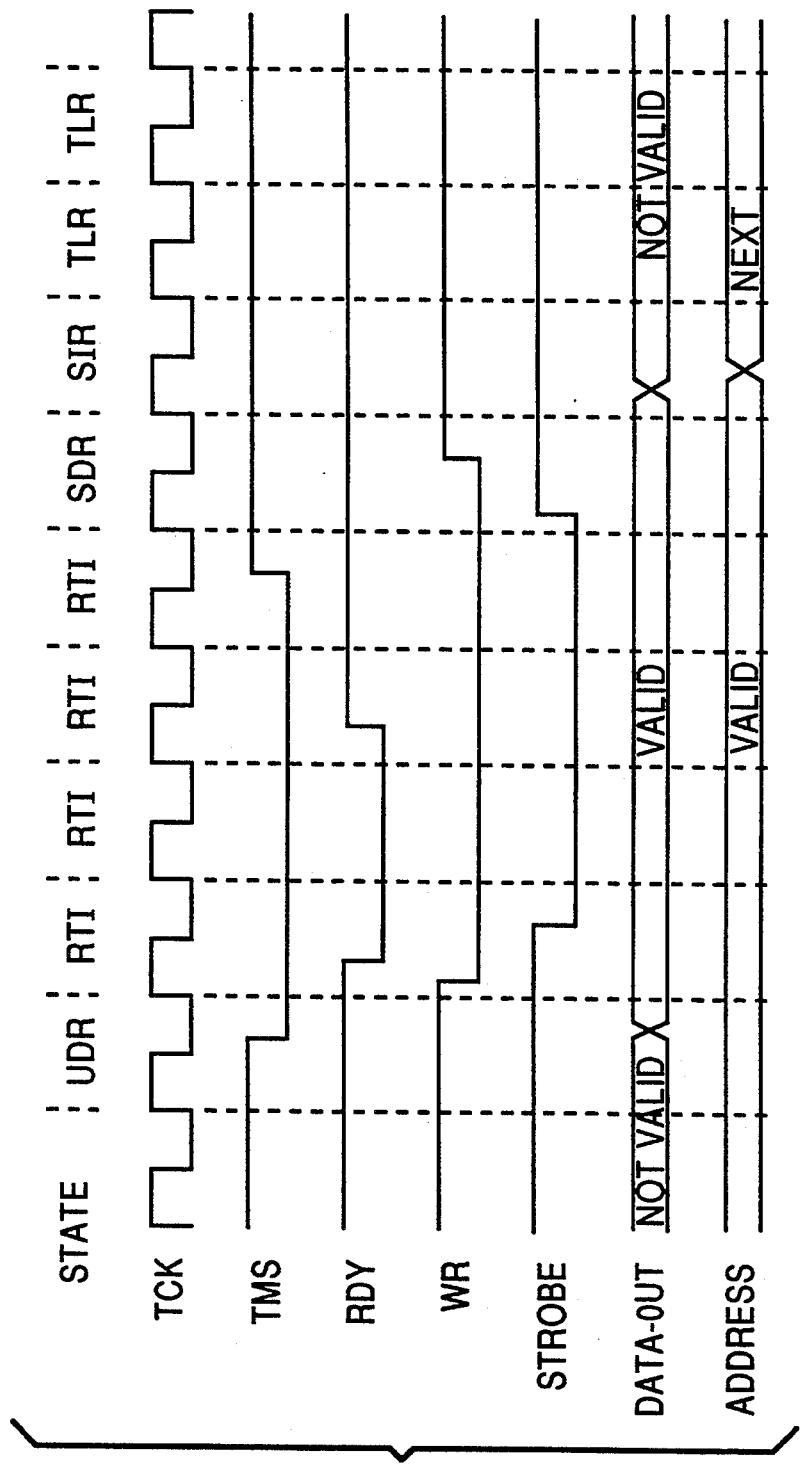
FIGS. 7 and 8 are timing diagrams for write and read operations, respectively, for the memory of FIGS. 5 and 6 and for registers external to the bus.
Figure 8:
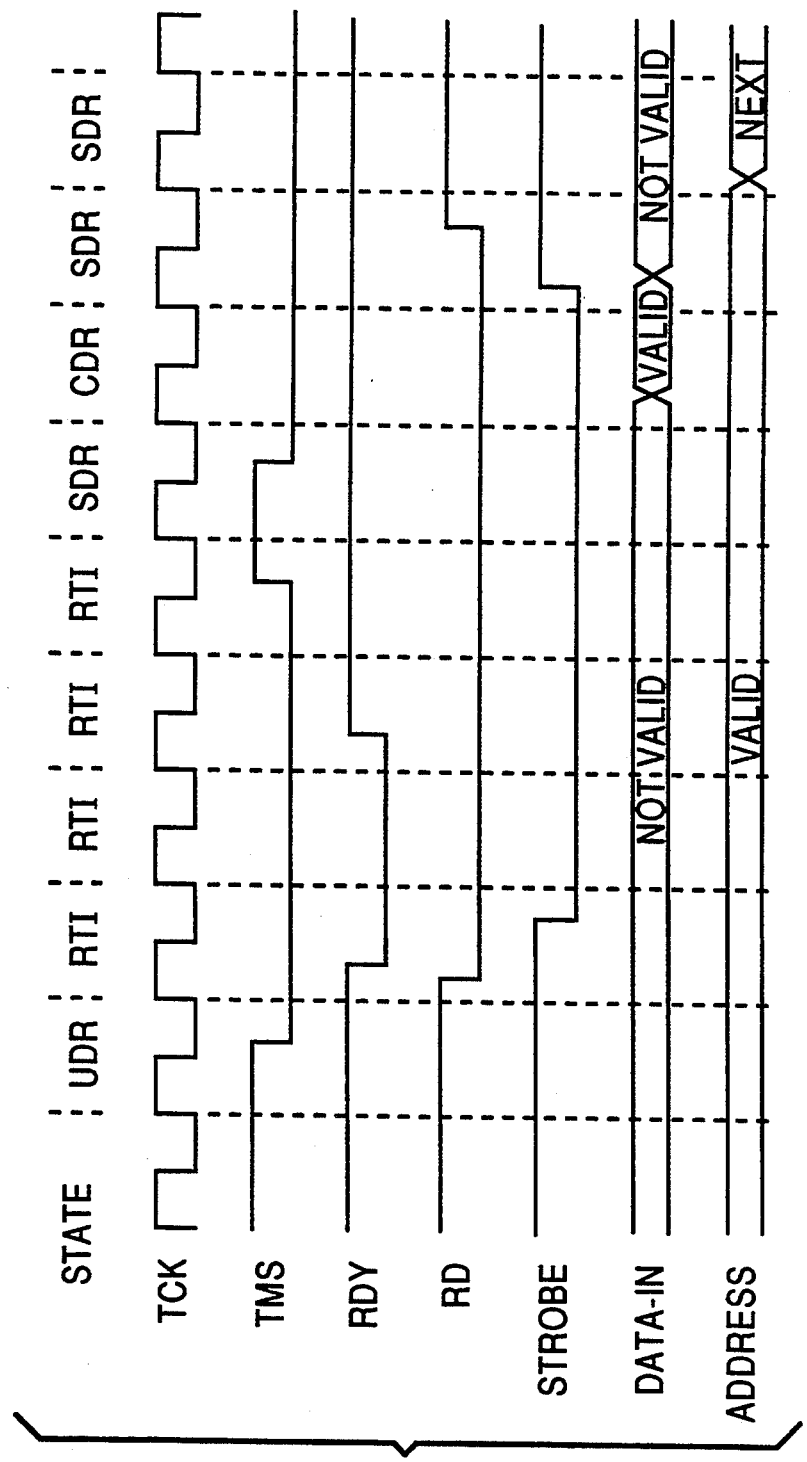

Reference will now be made to FIG. 5 which illustrates the configuration registers 116 of FIG. 3 in more detail. In addition, the configuration registers 116 are shown as being able to access a nonvolatile memory 138 and an external configuration register, i.e., a register external to the test bus, from the test bus. Timing diagrams for reading and writing the memory 138 and external registers are shown in FIGS. 7 and 8 and will be referred to hereinafter for clarification of those operations.

The memory 138 may comprise any form of nonvolatile memory such as EEPROM, RAM or other memory devices and may be either internal or external to the test bus structure. In FIG. 5, the configuration registers 116 are illustrated as comprising n internal configuration registers $116_a$ through $116_n$ with internal configuration registers $116_c$, $116_f$ and $116_g$ interfacing with the memory 138 and internal configuration register $116_n$ being identified as either an internal configuration register and receiving an update signal or an external configuration register and receiving a read/write RD/WR signal and generating a ready signal. Control signals for the configuration registers 116 are generated by a configuration register control circuit 116C.

To enable the JTAG bus to operate with additional test data registers, such as the configuration registers 116, two groups of JTAG user definable instructions, one for reads and one for writes, are provided for the CAT bus of the present application. The illustrated embodiment is implemented to provide sixteen configuration registers using an eight bit instruction field such that the following instructions are defined.

| INSTRUCTION (binary) | COMMAND DEFINITION |
| --- | --- |
| p0nnnn01 | Read Configuration Register (nnnn = register number) |
| p0nnnn10 | Write Configuration Register (nnnn = register number) |

Where p=is an instruction parity bit. For example, to read the status of the sixth configuration register CR6, $116_f$, a JTAG instruction would be issued with the binary value of "10011001", using even parity.

To expand the number of configuration addresses, three ports of the configuration address space, i.e., three of the configuration registers $116_c$, $116_f$ and $116_g$, are arranged to provide a subaddress extension space within the memory 138. Two of these ports, configuration registers $116_f$ and $116_g$, are concatenated to define the subaddress and the third port, configuration registers $116_c$, is used to write or read data to the subaddress within the memory 138 addressed by the concatenated contents of the configuration registers $116_f$ and $116_g$. To facilitate sequential accesses of the subaddress space, a subaddress auto-increment function is provided to increment either one of the ports or configuration registers $116_f$ and $116_g$ which define the address for the memory 138. The auto-increment function is enabled and disabled via a bit in the configuration register 0010 labeled "control" in FIG. 6.

Figure 6:
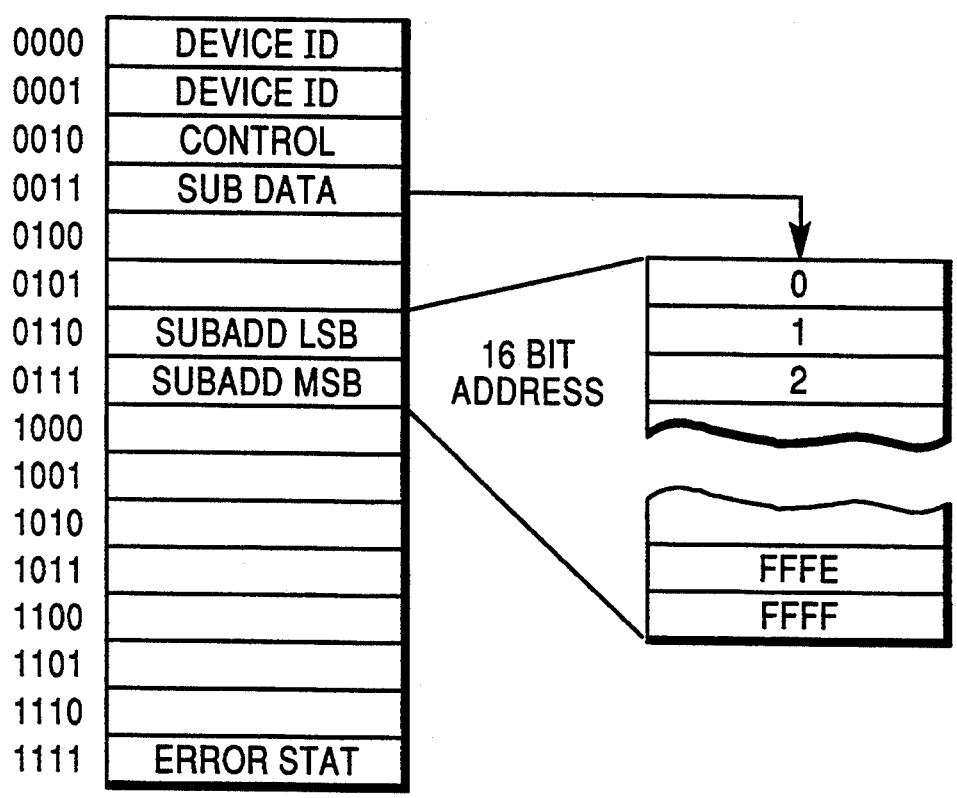
FIG. 6 illustrates a sixteen register organization for the configuration registers of FIG. 5, each register having 8 bits with the contents of two memory registers being concatenated to address a memory having a 64K subaddress space.

It is noted that the subaddress range depends on the number of bits per configuration register. For example, an eight bit register size results in a 16 bit subaddress if the two configuration registers $116_f$ and $116_g$ are concatenated as illustrated to provide a 64k subaddress range. An illustration of this 16 register arrangement with subaddress extension into the memory 138 is shown in FIG. 6. The subaddress extension concept is particularly useful for interfacing with memory devices such as EEPROM and RAM which may contain status and/or configuration information for the computer system including the CAT bus.

To enable the JTAG bus to operate with devices which may not be able to respond within a default access time defined for the JTAG bus, such as the memory 138 and external registers exemplified by the configuration register $116_n$, a mechanism for pacing or handshaking accesses to such devices is provided. The pacing function is accomplished by means of the ready, RDY, signal added to the JTAG interface as shown in FIGS. 1, 2, 4, 5 and 9-11. The ready RDY signal is deactivated by a JTAG device upon selection if it cannot respond to a data read or write access within a default access time which is dependent on the frequency of the JTAG clock, TCK.

Figure 4:
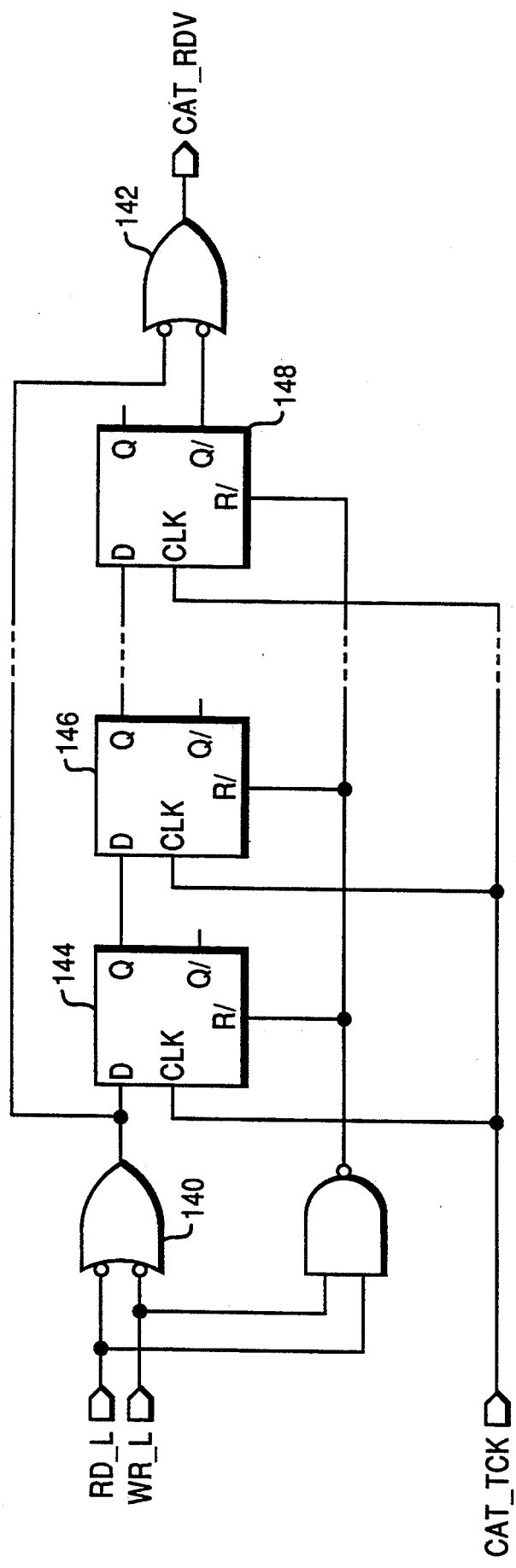
FIG. 4 is a schematic diagram of an exemplary circuit for generating the RDY signal.

FIG. 4 illustrates how the ready RDY signal can be implemented in a register or memory device which requires additional time to respond to read and write commands. As shown in FIG. 4, a read signal RD_L is activated during a read command of an external register or a memory device such as the memory 138 and a write signal WR_L is activated during a write command of an external register or memory device. At the beginning of a read or write operation, the RDY signal is deactivated by means of NAND gates 140, 142 until a number of pulses of the JTAG clock TCK are received and passed through D-flip-flops 144, 146 and 148 to reactivate the ready RDY signal. The number of D-flip-flops provided corresponds to the number of clock pulses and therefore the time required for access of a corresponding device including the ready RDY signal generating circuitry. Of course a large variety of arrangements will be apparent to those skilled in the art for generating the pacing or ready signal as described herein.

Figure 9:
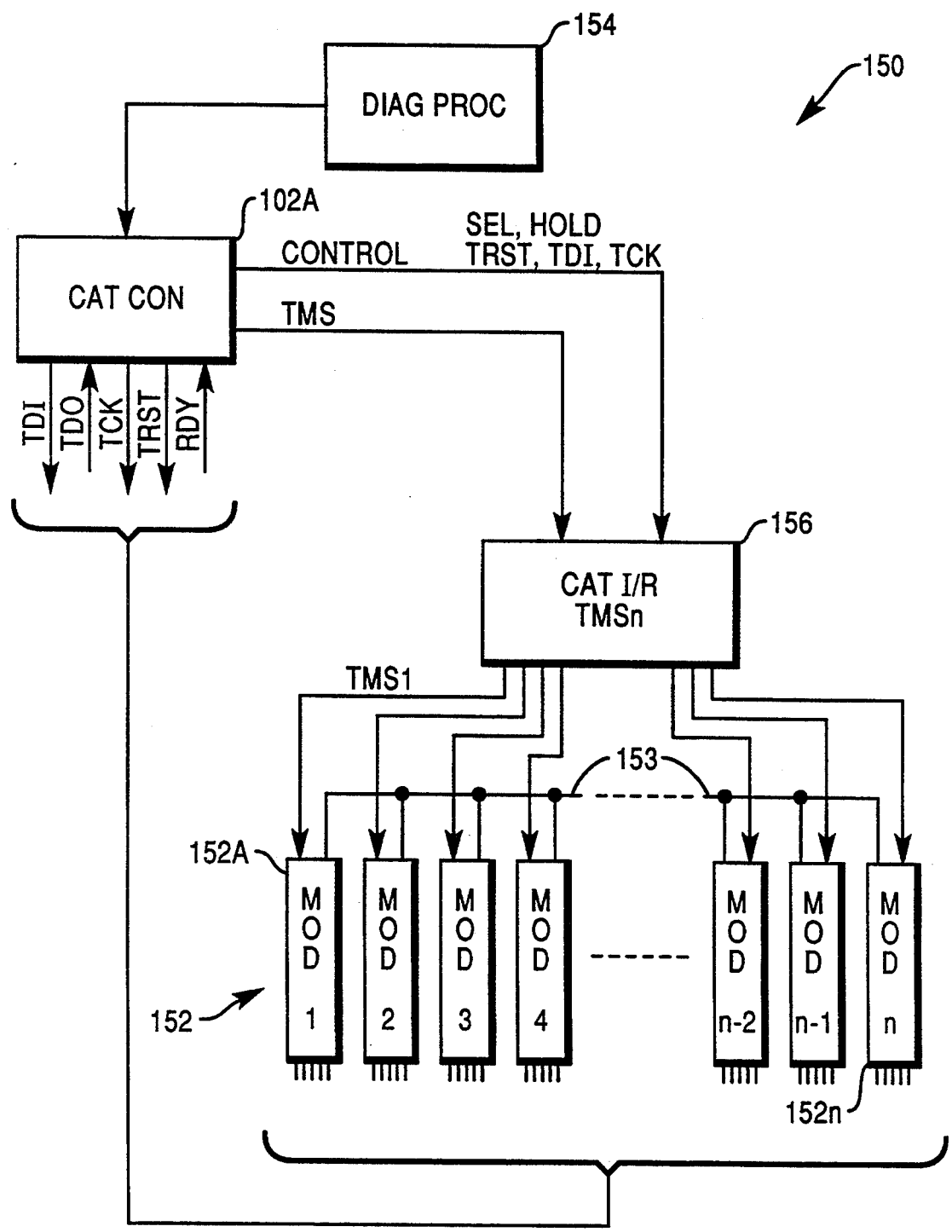
FIG. 9 is a schematic block diagram of a configuration and test (CAT) bus architecture in accordance with the present application for a computer system having a plurality of modules.

Prior to describing operation of the CAT bus of the present application for reading and writing the memory 138 and any external registers exemplified by the configuration register $116_n$, inclusion of the CAT bus within a computer system will be described with reference to FIGS. 9-11. In FIG. 9, the CAT bus is shown as being incorporated into a computer system 150 having a plurality of modules 152 which make up the system 150. Each of the modules 152 typically will in turn be made up by a plurality of integrated circuit devices which can be any off-the-shelf devices; however, in the illustrated embodiment, application specific integrated circuits or ASICs are used and thus will be indicated herein. In accordance with the present application, the CAT bus provides a convenient arrangement for not only testing the ASICs which are interconnected to form one of the modules 152 but also permits testing of the modules 152 and the system interconnections of the modules 152.

For ASIC level testing, the CAT bus architecture of FIGS. 3 and 5 is incorporated into each of the ASICs and is operated to test the ASICs operation at the chip level. The CAT bus architecture of FIGS. 3 and 5 is also incorporated into each of the system modules 152 to permit testing of the computer system 150 on the module level. Finally, the CAT bus of the present application is used to test at the system level by generating test signals from each of the modules 152 onto a parallel or common bus, for example a system bus 153 shown in FIG. 9, and monitoring the resulting signals which are received by the remaining modules 152 as will be more fully described hereinafter.

While the CAT bus of the present application is generally applicable to devices, modules and entire computer systems, it has been implemented as a part of a multiple processor computer system which is the subject of a U.S. patent application Ser. No. 07/760,786 which was filed on Sep. 16, 1991, is entitled ARCHITECTURES FOR MULTIPLE PROCESSOR COMPUTER SYSTEMS, is assigned to the same assignee as the present application and is incorporated herein by reference. Anyone desiring additional information regarding a computer system incorporating a CAT bus should refer to the referenced application.

Logic circuitry of a CAT controller 102A of FIG. 9 is controlled via control and data signals generated by a diagnostic processor (DP) 154. In response to a command from the diagnostic processor 154, the CAT controller 102A selects a target module from the modules 152 for JTAG communication by transmitting an identification signal via the JTAG bus, i.e., the TDI-TDO serial path, to the configuration and test interface/router circuit CAT I/R 156. A select SEL signal is then activated to signal the CAT I/R 156 to decode the identification signal. The CAT I/R 156 then routes the TMS signal from the CAT controller 152A to the selected module. The CAT I/R 156 operates in accordance with conventional JTAG control procedures with the exception of the SEL signal, which activates a decoding of the module identification signal, and a HOLD signal which is used for intermodule testing at the computer system level as will be described hereinafter.

Figure 10:
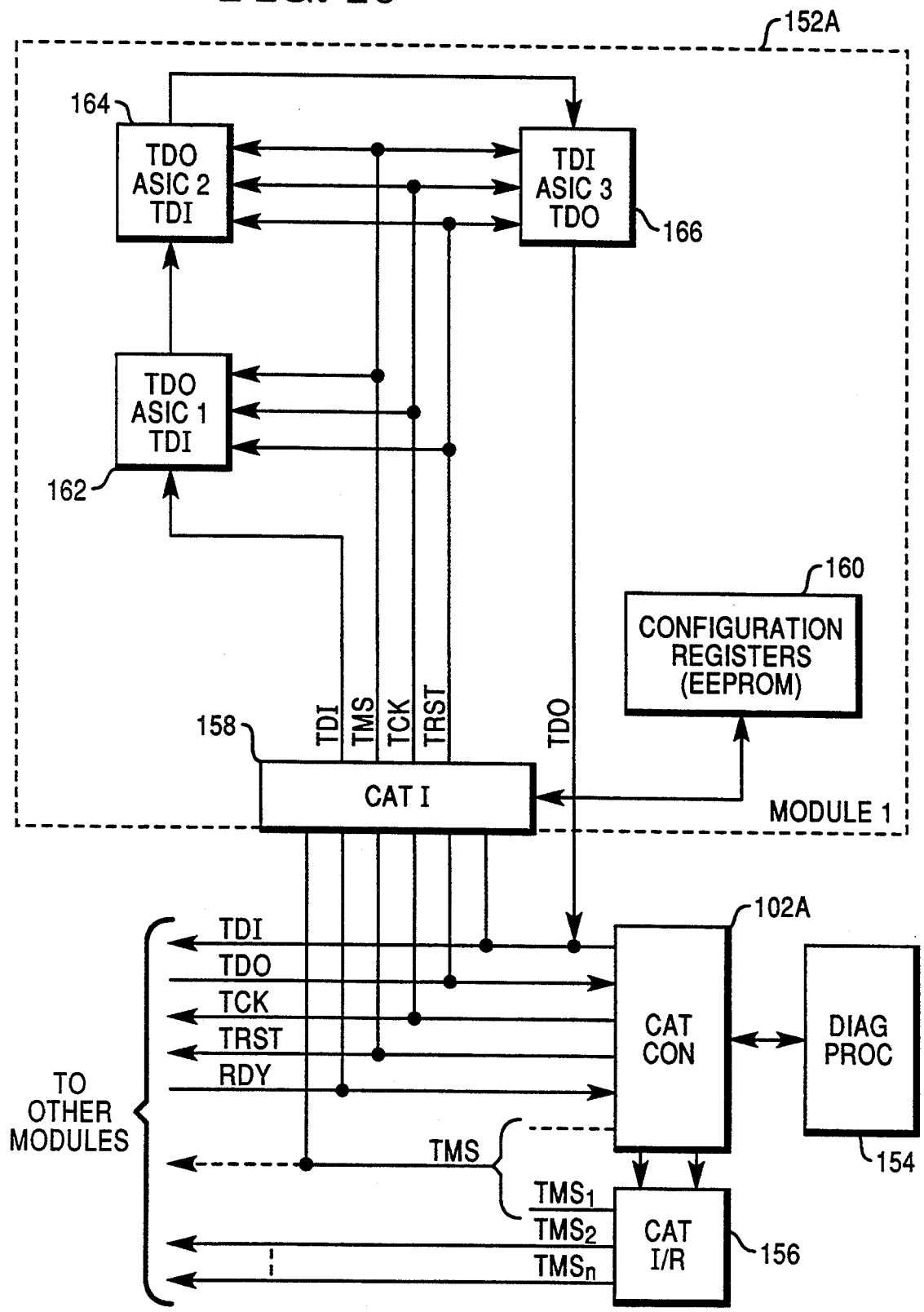
FIGS. 10 and 11 are schematic block diagrams of configurations of a CAT bus in accordance with the present application for use with a computer system module.
Figure 11:
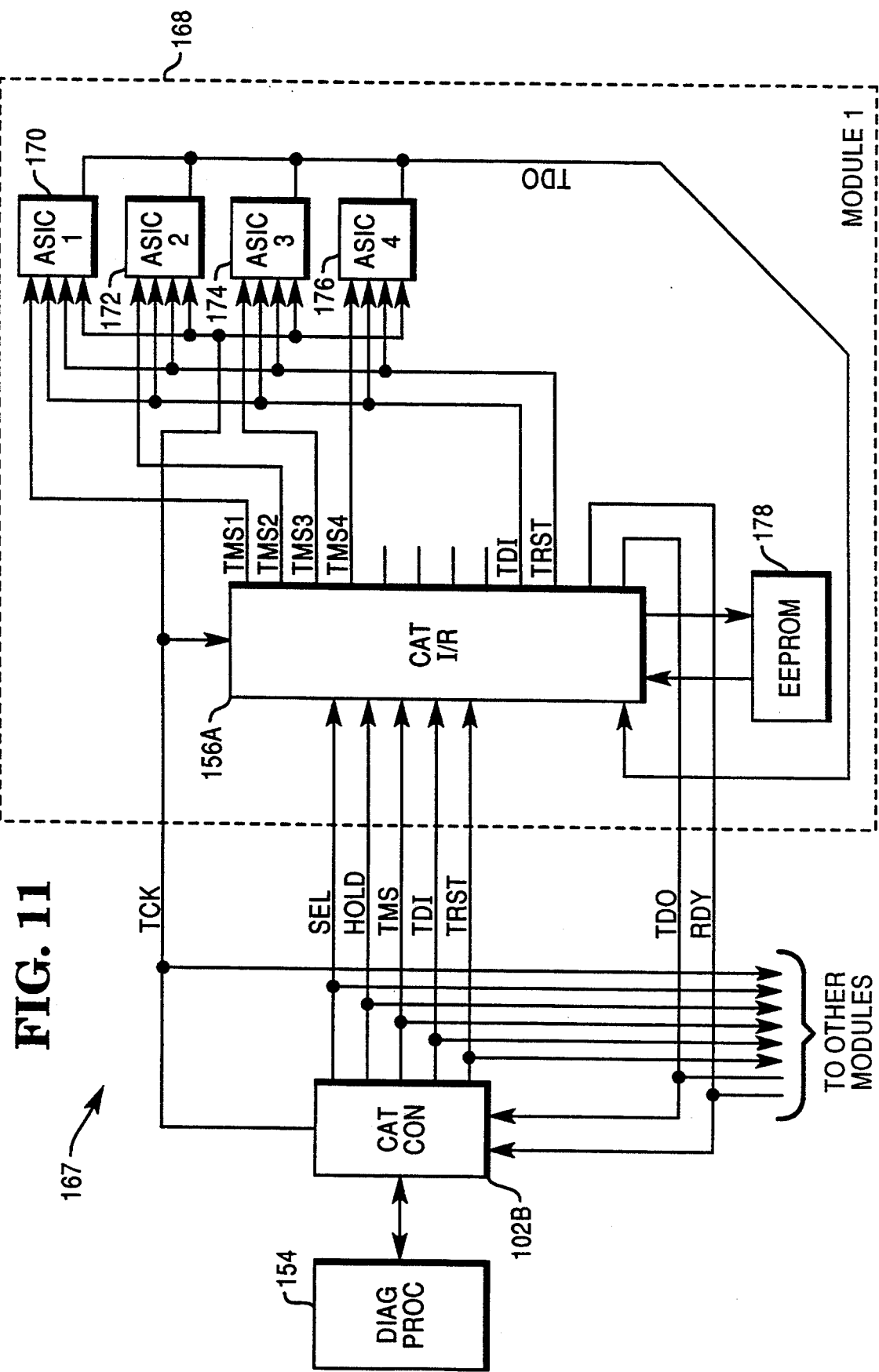

As shown in FIG. 10, each of the modules 152 interfaces to the CAT bus via a configuration and test interface CAT I circuit 158 which is preferably formed as an ASIC. Initially, after system reset, only the CAT I circuit 158 is in the serial test bus scan path for the module 152A. The primary function of the CAT I circuit 158 is to interface with module level configuration registers and memory, typically EEPROM, 160 via an 8-bit port. The configuration registers and configuration memory 160 are both shown as being external to the serial test bus in FIG. 10; however, they can be implemented as previously described relative to FIGS. 3 and 5. The EEPROM of the module level configuration registers and memory 160 may contain module identification information and revision level information as well as information about each JTAG device in the scan path on the module. After the diagnostic processor 154 acquires this information via operation the CAT bus, it will send a command to the CAT I circuit 158 to connect the JTAG scan path on the module 152A, and then the diagnostic processor 154 will diagnose the devices in the scan path, such as the ASICs 162, 164 and 166 shown in FIG. 10.

If the ready RDY signal is inactivated at the start of an access, the access will be suspended until the signal is reactivated. As previously mentioned, the HOLD signal or command permits interconnect testing among the modules 152. After the bus interface ASICs of one module have been sent a standard JTAG EXTEST instruction, the HOLD command is issued to the CAT I/R 156 which causes it to inhibit TMS transitions to this module while it remains in the RUN-test/idle RTI state. The other modules are activated and sent standard JTAG bus Extest instructions which cause their bus interface ASICs to sample the outputs of the first module. The diagnostic processor 154 can then compare the sampled data with the expected driven data to test interconnections among the modules 152. The module in the HOLD mode is returned to a RESET state and another module is selected to drive the system bus 153 with the resulting signals being again sampled at the other modules. This procedure is continued until all of the modules 152 have driven the system bus 153.

A computer system having a plurality of modules can be operated directly from the CAT controller 102A and the diagnostic processor 154 as suggested by the alternate provision of the TMS signal from the CAT controller 102A indicated by the dotted line TMS paths in FIG. 10. An alternate embodiment which provides for multiple serial TDI-TDO scan paths is shown in FIG. 11. Modules 168 are connected in parallel as in the embodiment of FIG. 10; however, devices on the modules 168, such as the ASICs 170–176, each have individual TDI-TDO scan paths.

Each module includes a CAT I/R circuit 156A which contains TMS selection circuitry as described for the CAT I/R 156 of FIG. such that the ASICs 170–176 are selected by the CAT controller 102B via ASIC identification signals and the SEL signal which is received by the CAT I/R circuits 156A of each of the modules 168. In this embodiment, the identification signals identify devices such as the ASICs 170–176 on a module rather than the module itself. The CAT I/R 156A operates with internal configuration registers (not shown) and memory comprising EEPROM 178 in the illustration of FIG. 11 as previously described herein. Intermodule testing of a computer system structured in accordance with this embodiment is performed substantially the same as for other embodiments; however, the set up is performed on a device by device basis for each module.

The timing diagrams of FIGS. 7 and 8 show the relationship of the signals required for write and read cycles, respectively, for memory and/or registers external to the bus system. The write WR signal, active low, initiates a write cycle and is enveloped by the register address. The STROBE signal, active low, is used to perform the write and is enveloped by the data. The read RD signal, active low, initiates a read cycle and is enveloped by the register address.

The sequence of TAP controller states for performing a write operation to an external configuration register, such as the configuration register $116_n$, is as follows: first a write configuration instruction is shifted into the TAP instruction register 134 by the state sequence - Test-Logic Reset (TLR), Run-Test/Idle (RTI), Select-DR, Select-IR, Capture-IR, Shift_IR (times the number of instruction bits, 8 herein), Exit-IR and Update-IR. The instruction in the instruction register 134 selects the configuration register identified within the instruction via the configuration register control 116C and a bidirectional selector circuit 116S. The data to be written to the external configuration register is next shifted into a shift register 180 by the bus system controller 102 by the state sequence - Select-DR, Capture-DR, Shift-DR (times the number of data bits, 8 herein), Exit-DR, Update-DR and back to RTI. At this point, the selected JTAG device such as the configuration register $116_n$, receives the write WR signal and can deactivate the READY signal which is combined with any other ready signals from other devices by the configuration register control circuit 116C to generate the CAT ready CAT_RDY signal and the bus system controller 102 will maintain the TAP controller 114 in the RTI state until the CAT_RDY signal is again activated. Reactivation of the CAT_RDY signal results in the WR and STROBE signals going inactive and the TAP controller 114 returning to the TLR state. FIG. 7 can be referred to for additional details regarding write operations to an external configuration register and/or memory.

The sequence of TAP controller states for performing a read operation to an external configuration register, such as the configuration register 116$_n$, is as follows: first a read configuration register instruction is shifted into the TAP instruction register 134 by the state sequence described above for the write operation. At the end of this sequence, the TAP controller 114 enters the RTI state and the selected external configuration register receives the read RD signal and can deactivate READY signal resulting in a CAT_RDY signal as just described.

When the external configuration register has had time to access the data, the CAT_RDY signal is reactivated. The reactivation of the CAT_RDY signal results in the RD and STROBE signals going inactive and the TAP controller 114 progressing through the data acquisition states as follow: Select-DR, Capture-DR, Shift-DR (times the number of data bits, 8 herein), and Update-DR states. The TAP controller 114 then returns to the TLR state. FIG. 8 can be referred to for additional details regarding read operations to an external configuration register and/or memory.

Operation of the CAT bus of the present application with external configuration registers and/or memory devices is as just described while internal configuration registers are selected and written in accordance with conventional JTAG bus operating procedures as will be apparent to those skilled in the art.

It is important to be able to detect errors in instructions used to control a CAT bus as disclosed in the present application for proper configuration and testing of computer systems incorporating the bus. To this end, provisions are made to detect errors in instructions received over the CAT bus. One arrangement for detecting instruction errors is to include a parity bit in each instruction, for example as described above relative to the two groups of JTAG user definable instructions for reading and writing configuration registers and memory devices. Unfortunately, when a parity error is detected on an ASIC, a module or other entity tested by the CAT bus, feedback to the bus system controller or diagnostic processor is required from the entity detecting the parity error which results in higher pin counts or connections for the entity.

In the CAT bus of the present application, each ASIC, module or other entity is made such that an erroneous instruction, whether detected by parity error failures or otherwise, places the entity into the bypass mode. Thus, if one or more entities on the CAT bus detect an instruction error, a shorter than expected register, i.e., the one bit BYPASS register, is connected into the scan path so that the length of the overall scan path becomes shorter than expected by the diagnostic processor. Accordingly, the CAT bus needs only determine when the length of the overall scan path has been shortened to detect that an erroneous instruction has been received by an entity along the path. The diagnostic processor must know what the correct scan path length is so that when specific data is shifted into the scan path, the diagnostic processor knows when to expect the data to return to an eight bit data port or register in the CAT controller.

In accordance with this aspect of the present application, a shortened scan path and hence an instruction error is detected by prefixing a header to the data that is shifted into the TDI-TDO scan path following an instruction scan. The header is set up to be equal in length to the length of the longest register in the scan path with the understanding that more than one register can have this length. The header is formed to have x of its least significant bits equal to the same digital value, preferably 1, with x being equal to the shortest register in the scan path less one or one if the shortest register is one bit, with the remainder of the header bits being equal to the opposite digital value, preferably 0. Of course, as with the longest register length, there can be more than one register in the scan path with the shortest length. Padding bits are provided to precede the header so that the header and data form a multiple of the number of bits contained within the data register of the CAT controller.

The diagnostic processor keeps track of the shifting of the padding/header/data bits and captures the contents of the CAT controller data register as the data is shifted into the scan path. By determining whether or not the least significant bit of the data register is a 1 when the data register contains the first byte of the header, all instruction single errors such as parity errors can be detected. If an error such as a parity error occurs, the 1s in the header would not be in the data port at the expected time. The 1s would be shifted out and a 0 would be in the least significant bit (LSB) position of the first header byte instead of a 1. By examining the entire first byte of the header, two or more parity errors can be detected with at least 99.6% confidence level. By attaching the described header to a data scan that follows an instruction scan, parity errors can be detected without feedback from the ASICs, modules or other entities on the CAT bus and without increased pin on connections counts.

A simple example of parity checking instructions sent to a module including three ASICs in accordance with this aspect of the present application will now be described with reference to FIGS. 12-14. As shown in FIG. 13, a first ASIC 200 has been instructed to connect an eight bit register into the scan path; a second ASIC 202 has been placed into the bypass mode such that its one bit bypass register has been placed into the scan path; and, a third ASIC 204 has been instructed to connect a four bit register into the scan path. FIG. 12 shows the bit pattern that is to be shifted into the scan path through the ASICs 200, 202 and 204 and includes scan path data 0111010001110, a header 00000001, and pad bits PPP which can be either 1s or 0s.

As previously described, the header is equal in length to the longest register in the scan path, eight bits for the ASIC 200, and includes a number of 1s in the least significant bit positions equal to the shortest register less one or one if zero results. In this example since the ASIC 202 has been placed in the bypass mode and hence connects its bypass, i.e., a one bit register, into the scan path resulting in zero when one is subtracted from its length, the alternate of one is selected for the number of header 1s. The three pad bits PPP define the overall data to be scanned into the scan path as being 24, a multiple of an 8 bit data register 206 of the CAT controller.

As can be seen in FIG. 13, for the properly connected scan path a 1 results as the least significant bit in the 8 bit data register 206 of the CAT controller after the data has been scanned into the scan path. Thus, FIG. 13 illustrates proper receipt of the header and verification of no errors in the instruction scan. In FIG. 14, the same set of ASICs is shown; however, an error was encountered in the instruction for the third ASIC 204 such that it placed its bypass register into the scan path rather than the four bit register requested by the correct instruction for the third ASIC 204. Thus, the scan path has been shortened.

When the contents of the data register 206 of the CAT controller is examined after shifting the data into the scan path, an instruction error is indicated because the least significant bit is 0 rather than 1 as required for instruction validation. If there were two or more parity errors, the diagnostic processor would read xxxxxxxx; however, by comparing the expected first byte of the header to the value read, there is 99.6% confidence that if two or more parity errors occur, the value read will not match the expected value.

As previously described, the provision of memory within the architecture of a CAT bus can advantageously be used to store and retrieve status and/or configuration information for the computer system and even the CAT bus itself. For example, to enable the CAT bus to perform boundary scan functions, the diagnostic processor must know how the configuration of the boundary scan path for each of the one or more modules which are interconnected to configure a computer system. Without knowledge of the boundary scan path it is impossible for the CAT bus to perform any JTAG operations. In accordance with the CAT bus of the present application, information fully describing the CAT bus is provided in nonvolatile memory on each module of a system, for example in an EEPROM. The layout of information in a module memory is designed to minimize the amount of memory needed and reduce the complexity of using the information contained in the memory.

To reduce the amount of memory required on a module, redundant device information is only stored one time into the memory with all identical devices on the module including a pointer for directing the CAT bus system to that information. The scan path tables are ordered according to the position of a part in the scan chain. There is a table for every device in a module's scan chain such that the CAT bus or more specifically the diagnostic processor of the CAT bus need only know the location where the first scan path table begins to locate the information for every boundary scan device. Thus, if information regarding the fourth device in the scan chain is required, the fourth scan path table entry is examined.

A JTAG device identification, device ID, is provided for each device on a module and uniquely identifies each JTAG device in the scan path. The device ID is in no way related to the JTAG ID defined in the IEEE 1149.1 specification even though the IEEE 1149.1 JTAG ID is stored for each type of device included on a module and of course each device of the same type will have the same IEEE 1149.1 JTAG ID. The unique device IDs are assigned to each part on the scan chain for identification of the devices in the scan chain. The diagnostic processor will know where a device is located in the scan path by comparing its device ID to the device IDs in the scan path tables. For example, if the diagnostic processor wanted to determine where in the scan path the device with a device ID equal to 6 was located, the diagnostic processor would sequentially step through the scan path tables. If the device ID in the third scan path table was 6, the diagnostic processor would know that the device with an ID of 6 is located third in the boundary scan chain. This information storage arrangement permits rearrangement of the boundary scan path to be performed provided the scan path tables are similarly reordered to reflect the new ordering of the boundary scan path.

The following describes tables which are stored in memory including what information is stored and the usefulness of the information. FIGS. 15-18 illustrate tables in accordance with one embodiment of this aspect of the present application and where required are used to illustrate a boundary scan path for a module having three devices, ASICs, connected into the boundary scan path. As previously noted, the devices are positioned in the scan path tables in the order in which they are connected in the boundary scan path such that device #1 300 is assigned the first scan path table 302, device #2 304 is assigned the second scan path table 306, and device #3 308 is assigned the third scan path table 310, see FIGS. 15 and 16.

Figures 15, 16:
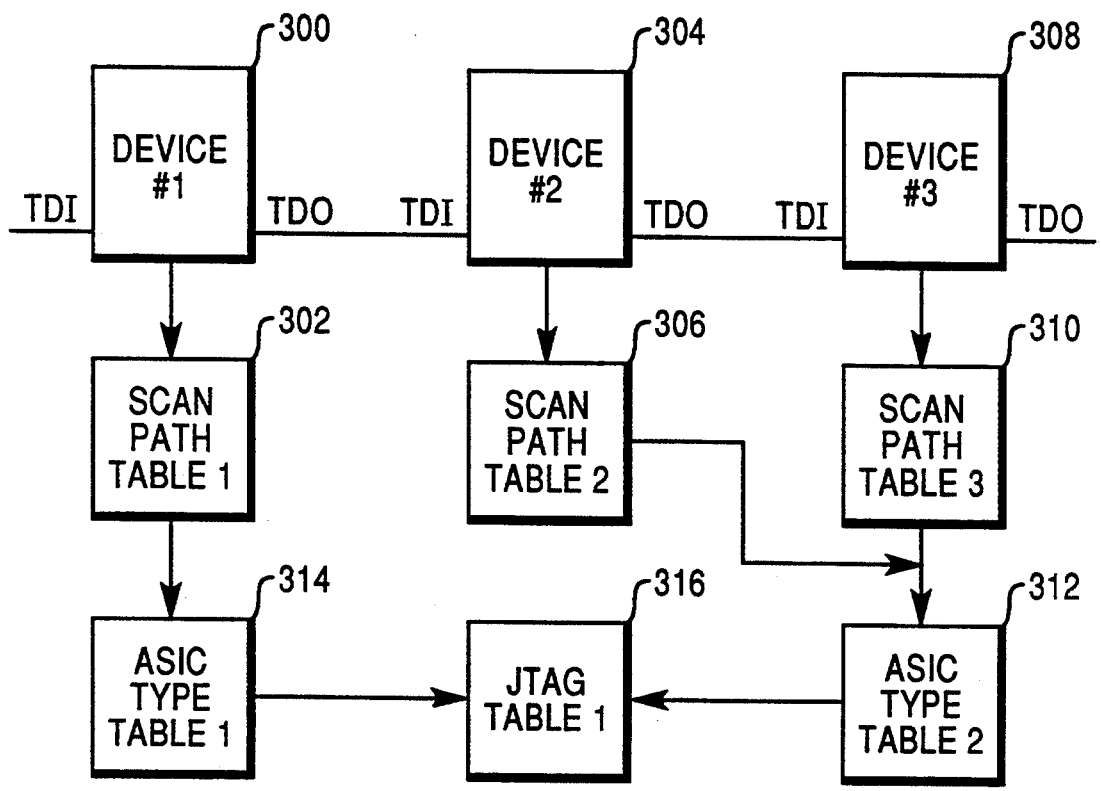

The scan path tables 302, 306 and 310 provide device identification, i.e., the unique identification of the JTAG device in the scan chain, as shown the ASICs are identified in the table of FIG. 16 as 3, 7 and 6, respectively. The scan path tables also point to the device type table as illustrated in FIG. 17 which fully defines the JTAG information for the device, herein an ASIC. In the illustrated 3 ASIC boundary scan chain, the first and second tables for device #2 304 and device #3 308 point to the same ASIC type table 312 and the same configuration table since the second and third ASICs are identical and are configured with identical data. However, the ASIC corresponding to device #1 300 is not the same and requires different configuration data and is described by a different ASIC type table 314.

The entries in the device type tables exemplified by the table of FIG. 17 are in accordance with the requirements of the IEEE Std 1149.1 and will be apparent to those skilled in the art. Accordingly, all but one of these entries will not be further defined herein and interested readers are referred to IEEE Std 1149.1 for additional details and information. That one entry is the pointer PTR to a JTAG table 316 which identifies the location of JTAG instruction decoding information required for operation of the devices, i.e., device #1 300, device #2 304 and device #3 308 in the illustration. The storage of information required for JTAG operation on the devices on a module as just described relative to FIGS. 15-18 provides an arrangement which permits the diagnostic processor to control any device on a module without having prior knowledge of what type devices are on the module. Thus, the diagnostic processor only has to access memory on each module and read the corresponding information to obtain information enabling the diagnostic processor to perform all required JTAG operations on the module.

The previously mentioned testing of interconnections among modules of a computer system including a plurality of modules such as the modules 152 connected by a parallel or common bus such as the system bus 153 by means of a serial test bus will now be described in more detail. Testing interconnection among the modules 152 as part of system initialization or a normal start-of-day (SOD) process provides a significant increase in fault detection over prior art systems. Such testing permits isolation and deconfiguration of modules in which one or more failures occur so that the overall availability of a computer system is increased.

In addition to the information previously described as being stored in memory on each module of a multiple module computer system, for example the computer system 150 shown in FIG. 9, module specific information required for running intermodule testing by means of the standard JTAG EXTEST instruction will also be included in an EXTEST area of memory. The EXTEST area of memory contains module-specific information required to run intermodule EXTEST at system initialization, start-of-day or at other times as required.

A signal map table is constructed and stored in module memory to map each system bus signal to its corresponding position in the boundary scan path of the module. Signals are referenced by their position in the signal map table and remain constant across all modules in the multiple module computer system to eliminate the need for storing actual signal names. Each entry in the signal map table is 2 bytes long in a working embodiment in accordance with the present application. Twelve bits of each entry is used to indicate the signal's position in the boundary scan path of the module and the remaining four bits indicate whether the signal is driven by a given output test vector.

Figures 19, 20:
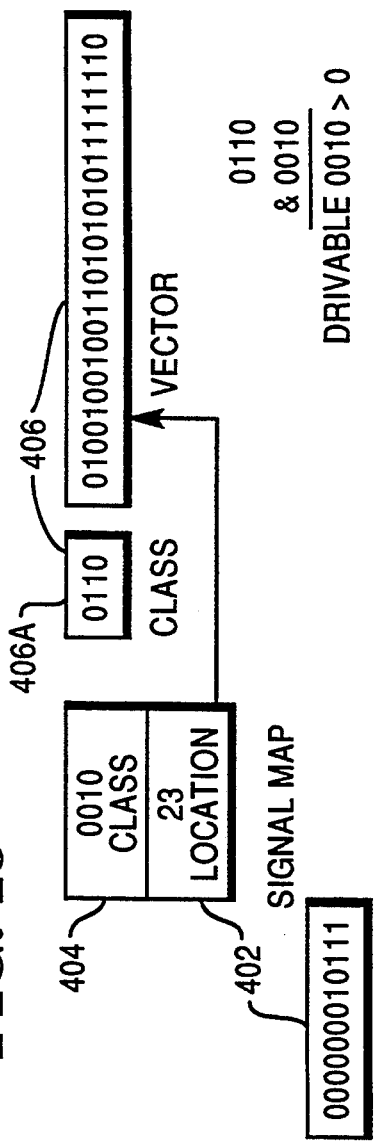
FIG. 19 illustrates an output test vector, a signal map entry and drive determinations for output test vectors in terms of vector classes.
FIG. 20 is a schematic block diagram of an EXTEST table constructed for intermodule testing of a multiple module computer system.
Figure 21:
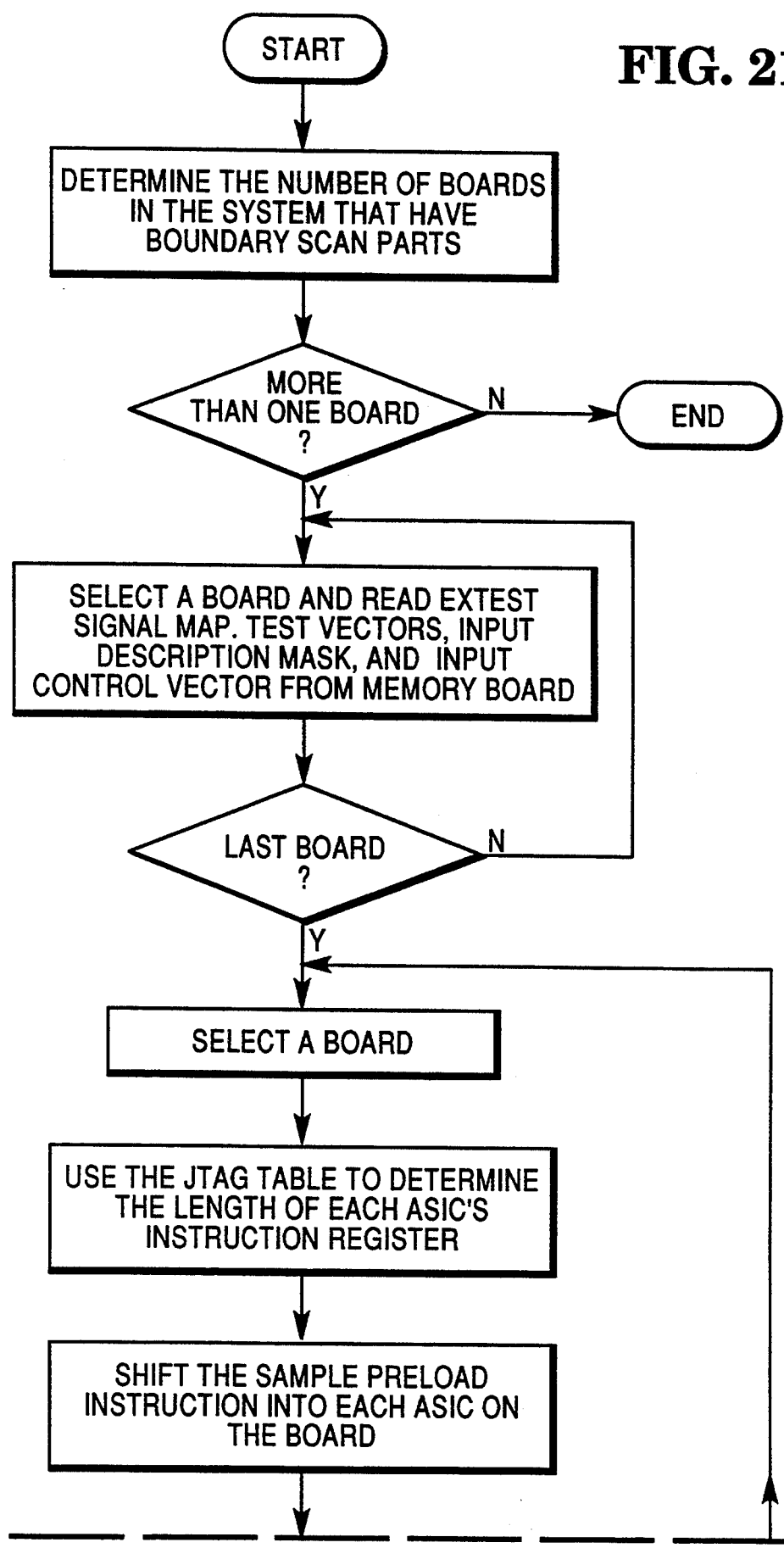
FIG. 21-25 when interconnected as shown in FIG. 26 form a flow chart for performing intermodule testing using JTAG EXTEST procedures.
Figure 22:
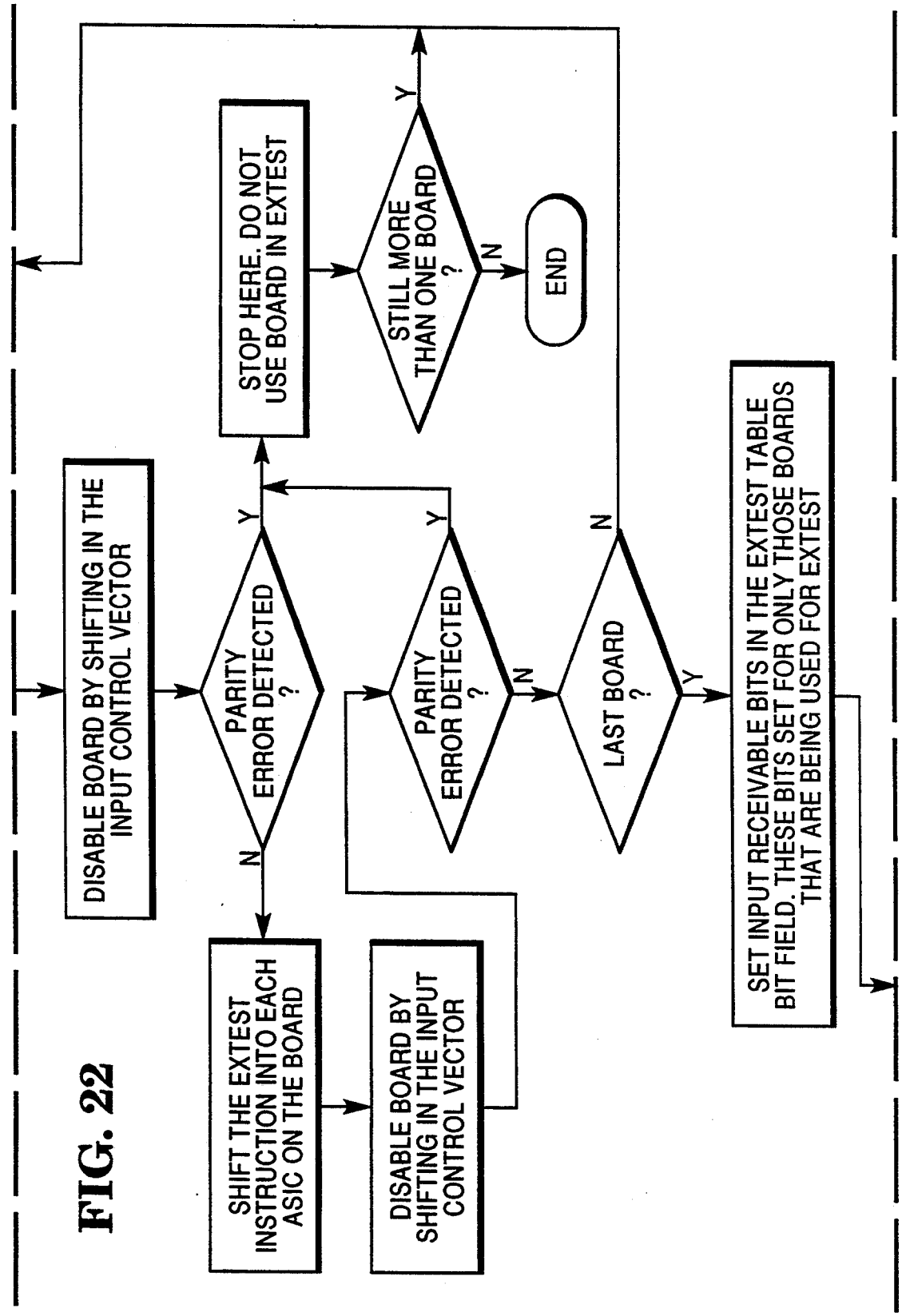
Figure 23:
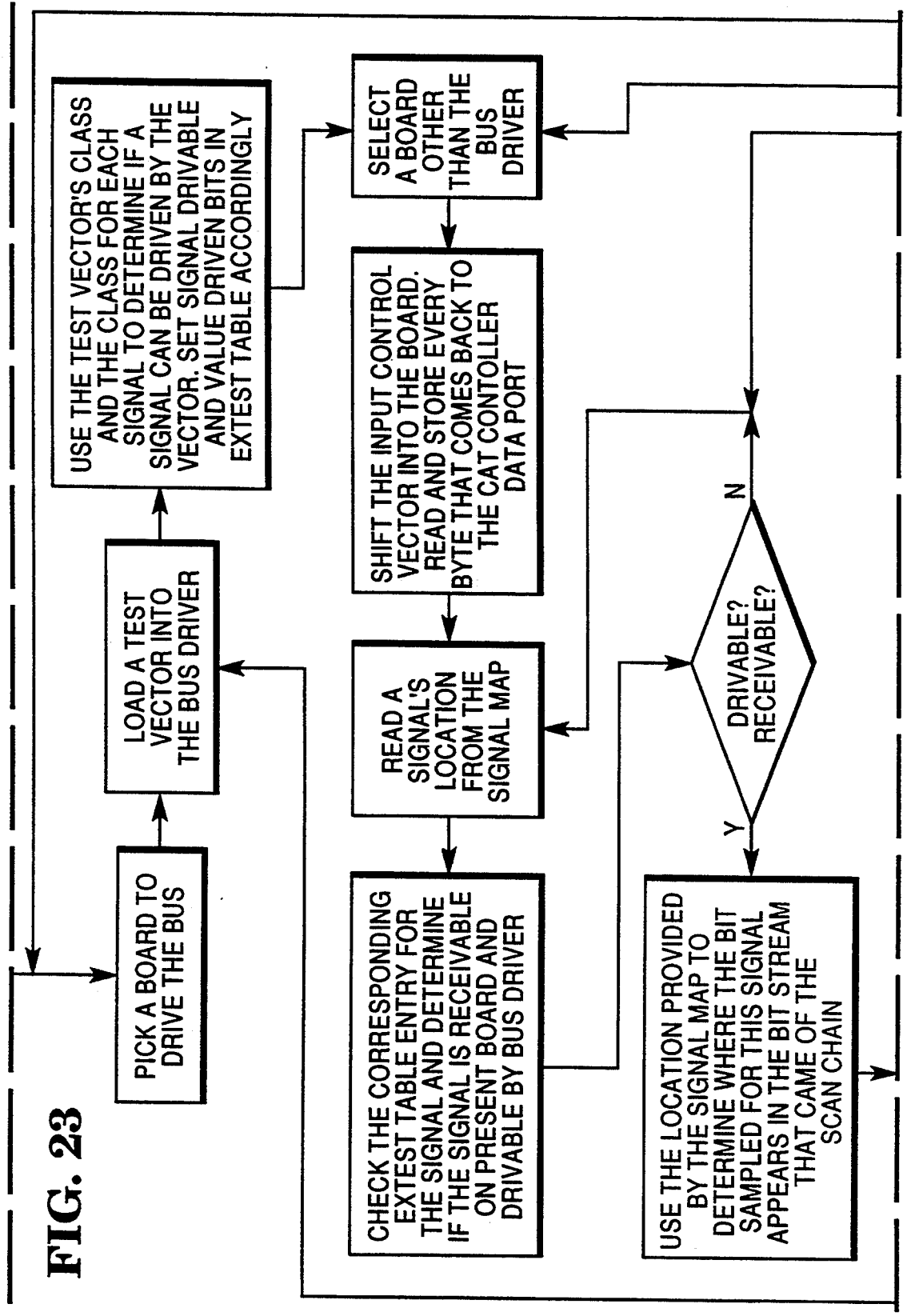
Figure 24:
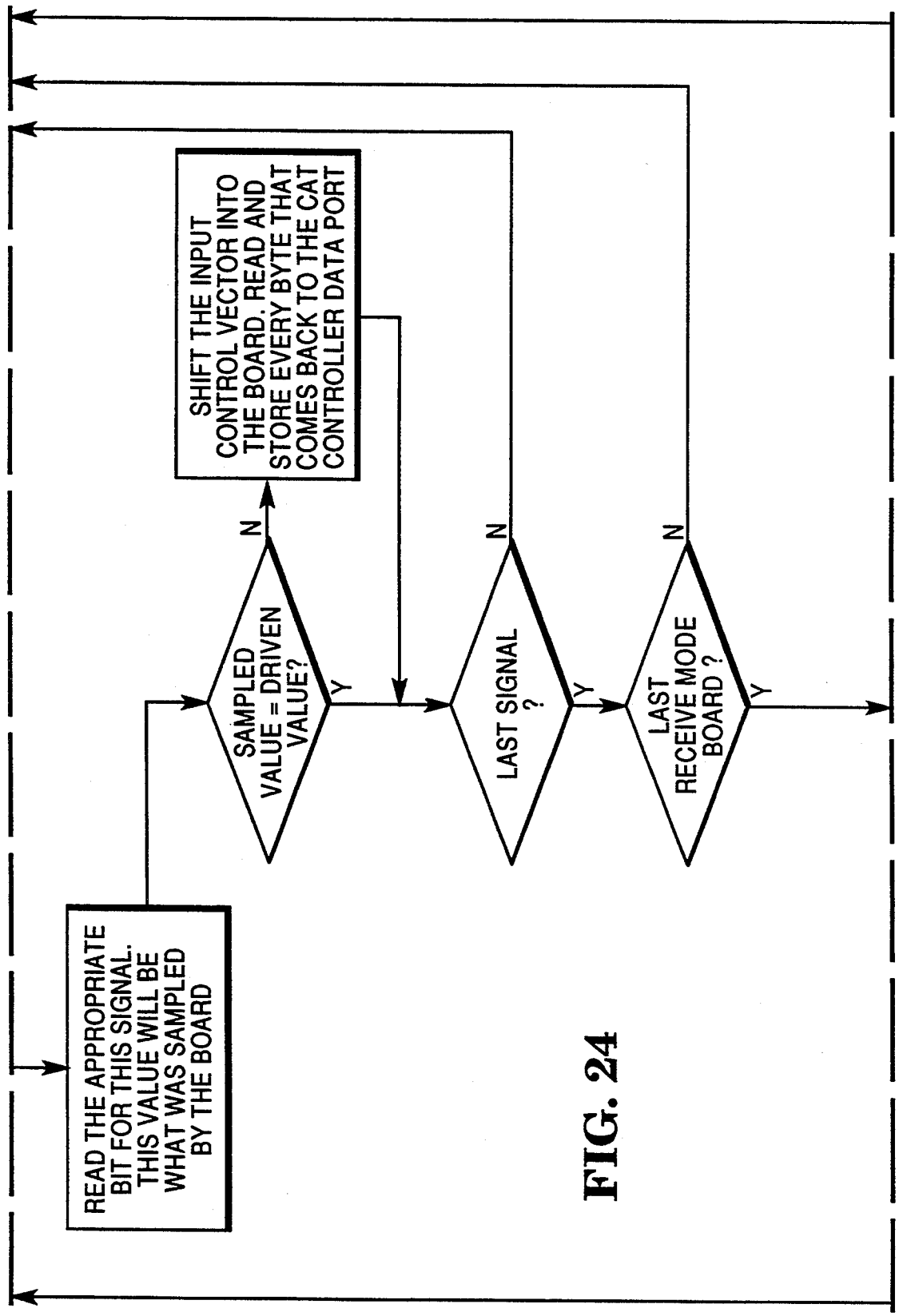

Thus, each system bus signal may be driven by up to four different classes of output test vectors. A one in any of these four bits indicates the signal is driven by the corresponding class of output test vector. A working embodiment provides for 256 system bus signals, making the total length of this table 512 bytes. As shown in FIG. 19, a signal map table entry comprises a twelve bit boundary scan path signal position 402 for the twenty third location 000000010111 along the boundary scan path and four bits 404 indicating that the signal is driven by output test vectors in the second class of vectors, 0010. It is possible that a single system bus signal is associated with more than one boundary scan position. Since the basic interconnection between modules can be verified with a single net, only one entry in the signal map table will be used. In the event that both input and output boundary scan cells are used for such a signal, the boundary scan location of the input will be stored in the signal map table.

An input description table or mask is constructed and stored in module memory to define which boundary scan path signals can serve as inputs for the module. The input description table is a bit map, with a single bit corresponding to each entry in the signal map table: if the ith bit in the input description map is a 1, then the ith entry in the signal map table is capable of being an input signal for the module.

Output test vectors are designed to include all boundary scan locations with a series of output test vectors being stored in module memory. Each output test vector is the length of the boundary scan path plus four bits. The additional four bits define the class of the output test vector, and are used to map the vector to the signals included in the signal map table. In the cases where more than one boundary scan position is associated with a system bus signal, the location identified in the signal map table is used as the primary control location. All other boundary scan cells for this signal will be set to the same value as the primary location.

The output test vectors include all necessary control information for tristate logic, open drain, etc. required to drive the output signals so that no additional signal information is required. For the board with the longest scan path in a working embodiment of the CAT bus of the present application, the length of each output test vector is 231 bytes. Accordingly, slightly more than 3K of memory space is required to store 15 output test vectors, which should be enough to provide reasonably good coverage. An output test vector 406 for a scan path having twenty seven locations is shown in FIG. 19 with the class 406A of the output test vector 406 indicating that it is in the second and third classes of output test vectors, i.e., the output test vector 406 will drive scan path locations in the second and third classes. Accordingly, as shown in FIG. 19, scan path location 23 will be driven by the output test vector 406 and it will be driven to a 1.

When a module is reset, each of the devices on that module go to a predetermined state. The devices need to be put in a different state to allow intermodule EXTEST. The initialization of the devices on a module is accomplished by means of an input control vector ICV which is written into the scan path to set all bidirectional pins to input, tristate all outputs possible, and disable other signals appropriately. The ICV vector is the same length as the boundary scan path and its construction will be apparent to those skilled in the art.

Only one of the modules 152 will drive the system bus 153 at a given time with the remaining modules being placed into a receive mode. The diagnostic processor sequentially selects a module to be the driver from the modules that have not yet driven the system bus 153. Once a driver is selected, the diagnostic processor places the remaining modules into the receive mode. To place a module into the receive mode, the diagnostic processor first controls the CAT bus interface circuit of the module to tristate any drivers on the module. Once the board is thus tristated, the JTAG devices on the module are given the sample/preload JTAG instruction to select the boundary scan register as the active register is the JTAG TDI-TDO scan path. The ICV is then shifted into the module, and the devices are given the EXTEST instruction. All modules except for the driving module are held in this state.

The diagnostic processor then loads an output test vector into the driving module. Once loaded into the driving module, the output test vector causes all drivable system bus signals to be driven onto the system bus. As the output test vector is being shifted into the driving module, the diagnostic processor inspects the bits of the test vector and builds an EXTEST table, see FIG. 20. The EXTEST table is used to make comparisons between the data driven onto the system bus by the driving module and the data received by the receiving modules. An example of a portion of an EXTEST table is shown in FIG. 20.

The diagnostic processor determines which signals are driven by using the vector class associated with each output vector and the entries in the signal map table. If it is determined that a signal can be driven by a certain test vector, the output drivable bit is set to 1 in the EXTEST table. It should be noted that this table does not actually include the signal number, but is ordered in the same manner as the signal map table. By following this strategy, signals can be referenced by their position in the signal map table, and expensive table lookups and name mapping can be avoided.

When the diagnostic processor determines that a signal can be driven, it will use the information in the signal map table to distinguish which bit in the boundary scan path is capable of driving the system bus signal.

The diagnostic processor will then determine the logic level that the bit is being set to. Since the output test vector is the same length as the boundary scan path, if the diagnostic processor needs to determine what logic level a given bit in the boundary scan path was set to, all it needs to do is read that bit in the test vector that was shifted into the driving module. The value driven is then be set to the appropriate state in the EXTEST table.

The EXTEST table may be represented in the diagnostic processor by an array of long words. Two bits of each entry will hold the bus driver information. Four bits are used to identify the driving module. The remaining bits will be used to describe the input modules. Each entry in a working embodiment has the capability of holding the driver information and information for up to fifteen receiving modules.

After the output test vector has been shifted into the currently selected driving module and the table entries have been made, the diagnostic processor holds the module in this state. The outputs are latched and the system bus signals are driven with whatever values are held in the boundary scan register. It should be noted that the test vectors are made to automatically set enables to desired states by shifting a test vector into the boundary scan register.

After an output test vector is placed in the module that is driving the bus, the remaining modules are sampled sequentially. Once sampling is complete, the diagnostic processor loads another output test vector into the bus driver module. If all output test vectors have been used for a given module, another module is selected to drive the system bus and the previous bus driver is put into the receive mode.

Once the receiving modules have been initialized via their ICV's, an output test vector is shifted into the next driving module. The ICV for the previous driving module and all other receiving modules are then shifted into those modules again to serve the dual purpose of returning the captured data to the CAT bus controller data port and initializing the previous driving module and all other receiving modules as receiver modules for the next output test vector which drives the system bus from the next selected driving module.

As the sampled data is shifted out of a module, the data is read a character at a time from the CAT bus controller data port. The sampled data is placed into an array of characters and the diagnostic processor uses the input description table to determine which bits in the sampled data array were driven by system bus signals. If a system bus signal is receivable on the board, a 1 is placed in the EXTEST table under input receivable. The diagnostic processor checks the bit value that was sampled only when there is a 1 in both the output drivable field and the input receivable field. Once the EXTEST table is completed, a comparison is made between the value driven and the value received to determine whether the test was passed for that signal.

Figures 25, 26:
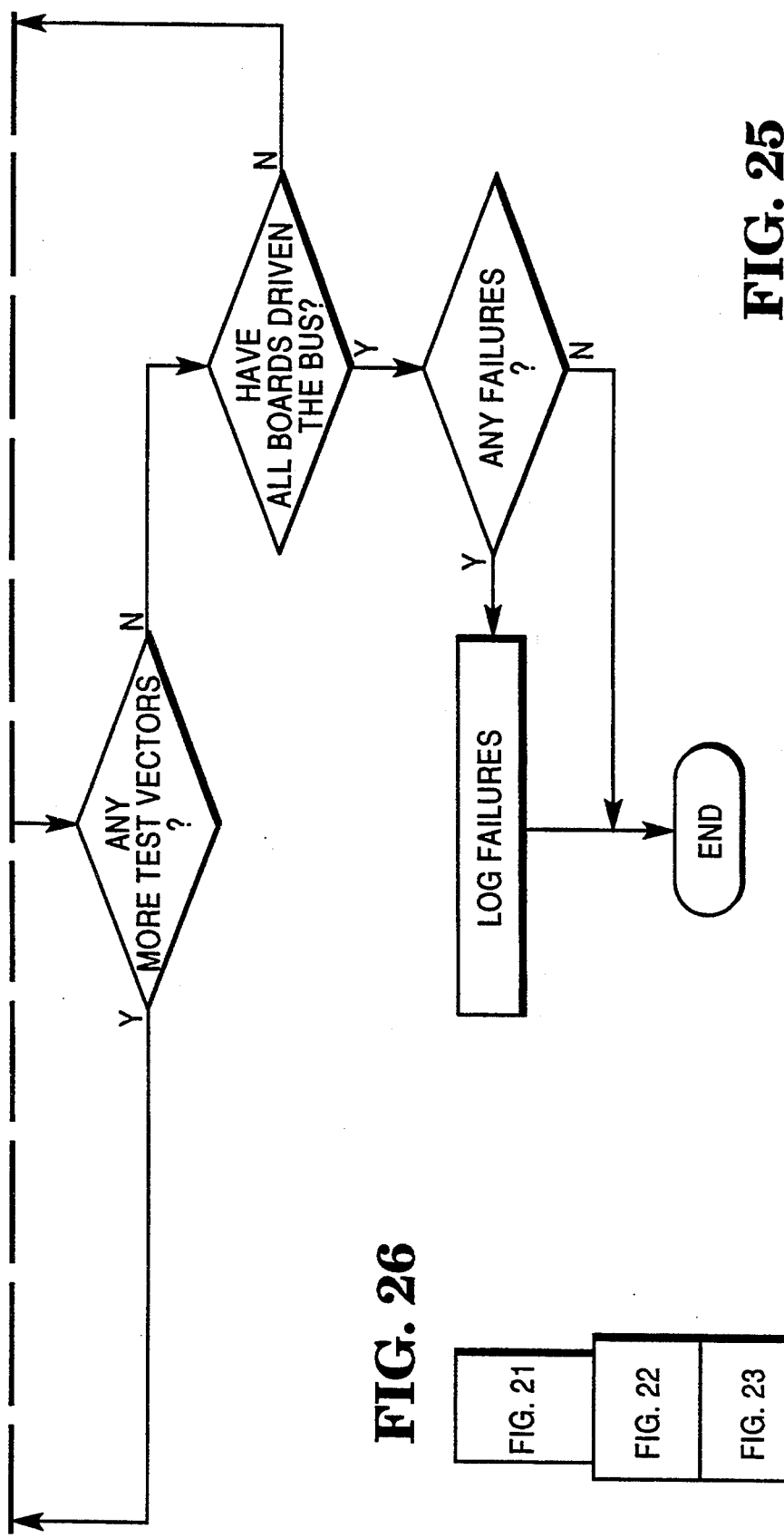
FIG. 26 illustrates proper interconnection of FIGS. 21-25.

After the signals have been checked on the signal receiving system bus modules, the diagnostic processor loads another vector into the module that is driving the system bus and repeats the process of checking the sampled signals. For additional details regarding testing of interconnections among modules of a computer system including a plurality of modules connected by a system bus by means of a serial test bus in accordance with the present application the reader is referred to FIGS. 21-25 which form a flow chart for such testing when interconnected as shown in FIG. 26. Each module or board of the system referred to in FIGS. 21-25 comprises a plurality of ASICs which are interconnected on the board.

Having thus described the invention of the present application in detail and by reference to preferred embodiments thereof, it will be apparent that modifications and variations are possible without departing from the scope of the invention defined in the appended claims.

What is claimed is:

1. A method of operating a computer system test bus to configure a computer system including said test bus, said method comprising the steps of:
   maintaining configuration information for said computer system;
   providing configuration register means for receiving said configuration information;
   interfacing said configuration register means with said test bus;
   defining a write operation for said test bus to write said configuration register means via said test bus; and
   performing said write operation to transfer said configuration information to said configuration means to thereby configure said computer system.

2. A method of operating a computer system test bus to configure and monitor a computer system including said test bus, said method comprising the steps of:
   maintaining configuration information for said computer system;
   providing register means for receiving said configuration information and information representative of operation of said computer system;
   interfacing said register means with said test bus;
   defining a write operation for said test bus to write said register means via said test bus;
   performing said write operation to transfer said configuration information to said register means to thereby configure said computer system;
   defining a read operation for said test bus to read said register means via said test bus; and
   performing said read operation to retrieve information representative of operation of said computer system from said register means.

3. A method of operating a computer system test bus to configure and monitor a computer system including said test bus as claimed in claim 2 further comprising the steps of:
   generating a ready signal indicating that said register means is ready to be read and written;
   inactivating said ready signal in response to initiation of performance of read and write operations in response to said read and write signals if said register means is not ready to be read and written; and
   reactivating said ready signal when said register means is ready to be read and written.

4. A method of operating a computer system test bus to configure and monitor a computer system including said test bus as claimed in claim 3 further comprising the steps of:
   providing memory means for storing information defining said computer system; and
   interfacing said register means with said memory means.

5. A method of operating a computer system test bus to configure and monitor a computer system including said test bus as claimed in claim 4 wherein the step of maintaining configuration information for said computer system is performed by storing said configuration information in said memory means.

6. A serial test bus for a computer system comprising:
test bus controller means for generating timing, data and control signals for operation of said test bus; and
test access means operable in response to signals from said test bus controller means for testing said computer system, said test access means including register means for receiving data from said test bus controller means for operation of said computer system for purposes other than testing.

7. A serial test bus for a computer system comprising:
test bus controller means for generating timing, data and control signals for operation of said test bus; and
test access means operable in response to signals from said test bus controller means for testing and configuring said computer system, said test access means comprising configuration register means for receiving data from said test bus controller means for configuring said computer system while not under test.

8. A serial test bus for a computer system as claimed in claim 7 wherein said configuration register means further provides for receiving status and error data from said computer system, said test bus controller means further providing for reading said configuration register means for monitoring and error logging operations for said computer system.

9. A serial test bus for a computer system as claimed in claim 8 wherein said test access means further comprises pacing means for delaying operation of said test bus controller means when performing read and write operations on said configuration register means whenever said read and write operations exceed a defined access time.

10. A serial test bus for a computer system as claimed in claim 9 further comprising memory means associated with said configuration register means and accessible therefrom for storing information defining said computer system.

* * * * *